US006586785B2

(12) United States Patent
Flagan et al.

(10) Patent No.: US 6,586,785 B2
(45) Date of Patent: Jul. 1, 2003

(54) AEROSOL SILICON NANOPARTICLES FOR USE IN SEMICONDUCTOR DEVICE FABRICATION

(75) Inventors: Richard C. Flagan, Pasadena, CA (US); Elizabeth Boer, Etiolles (FR); Michele L. Ostraat, Whitehouse Station, NJ (US); Harry A. Atwater, South Pasadena, CA (US); Lloyd D. Bell, II, Sunland, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/895,790

(22) Filed: Jun. 29, 2001

(65) Prior Publication Data

US 2002/0074565 A1 Jun. 20, 2002

Related U.S. Application Data

(60) Provisional application No. 60/215,390, filed on Jun. 29, 2000, and provisional application No. 60/215,400, filed on Jun. 29, 2000.

(51) Int. Cl.$^7$ ............................................. H01L 29/80

(52) U.S. Cl. ...................... 257/261; 257/77; 257/314; 257/321; 257/407; 257/412; 257/741; 438/503; 438/507; 438/509

(58) Field of Search .................... 257/77, 314, 321, 257/407, 412, 741; 438/503, 507, 509

(56) References Cited

U.S. PATENT DOCUMENTS

| 6,090,666 A | | 7/2000 | Ueda et al. | |
| 6,166,401 A | * | 12/2000 | Forbes | ........................ 257/314 |
| 6,344,403 B1 | * | 2/2002 | Madhukar et al. | ........... 438/503 |

FOREIGN PATENT DOCUMENTS

JP  11 111867  4/1999

OTHER PUBLICATIONS

PCT International Search Report dated Mar. 1, 2002 from corresponding PCT application No. PCT/US01/20829 filed Jun. 29, 2001.
PCT International Search Report dated Mar. 1, 2002 from PCT application No. PCT/US01/20827 filed Jun. 29, 2001.
Binnig, G. et al.; Atomic Force Microscope; Physical Review Letters; Mar. 3, 1986; vol. 56, No. 9; pp. 903–933.

(List continued on next page.)

Primary Examiner—David Nelms
Assistant Examiner—Mai-Huong Tran
(74) Attorney, Agent, or Firm—Christie, Parker & Hale, LLP

(57) ABSTRACT

A stratum or discontinuous monolayer of dielectric-coated semiconductor particles includes a high density of semiconductor nanoparticles with a tightly controlled range of particle sizes in the nanometer range. In an exemplary embodiment, the nanoparticles of the stratum are substantially the same size and include cores which are crystalline, preferably single crystalline, and include a density which is approximately the same as the bulk density of the semiconductor material of which the particle cores are formed. In an exemplary embodiment, the cores and particles are preferably spherical in shape. The stratum is characterized by a uniform particle density on the order of $10^{12}$ to $10^{13}$ particles/cm$^2$. A plurality of adjacent particles contact each other, but the dielectric shells provide electrical isolation and prevent lateral conduction between the particles of the stratum. The stratum includes a density of foreign atom contamination of less than $10^{11}$ atoms/cm$^2$. The stratum is advantageously used as the floating gate in a non-volatile memory device such as a MOSFET. The non-volatile memory device including the discontinuous floating gate of semiconductor nanoparticles exhibits excellent endurance behavior and long-term non-volatility.

31 Claims, 15 Drawing Sheets

OTHER PUBLICATIONS

Brust, Mathias et al.; *Synthesis of Thiol–derivatised Gold Nanoparticles in a Two–phase Liquid–Liquid System*; J. Chem. Soc., Chem. Commun., 1994; pp. 801–802.

Camata, Renato P. et al.; *Size classification of silicon nanocrystals*; Appl. Phys. Lett., American Institute of Physics; May 27, 1996; vol. 68, No. 22; pp. 3162–3164.

Dutta, Amit et al.; *Electron Transport in Nanocrystalline Si Based Single Electron Transistors*; Jpn. J. Appl. Phys.; Jul. 2000; vol. 39; pp. 4647–4650.

Dutta, Amit et al.; *Fabrication and Electrical Characteristics of Single Electron Tunneling Devices Based on Si Quantum Dots Prepared by Plasma Processing*; Jpn. J. Appl. Phys.; Jun. 1997; vol. 36; pp 4038–4041.

Dutta, Amit et al.; *Single Electron Memory Devices Based on Silicon Nanocrystals Fabricated by Very High Frequency Plasma Deposition*; Extended Abstracts of the 1999 International Conference on Solid State Devices and Materials; 1999; pp. 76–77.

Flagan, Richard C. et al.; *Fundamentals of Air Pollution Engineering*; 1988; Prentice Hall, Inc.: New Jersey; Chapter 5 Aerosols, pp. 290–357.

Flagan, Richard C., et al.; *Particle structure control in nanoparticle synthesis from the vapor phase*; Materials Science & Engineering; 1995; pp. 113–124.

Guo, Lingjie et al.; *A Silicon Single–electron Transistor Memory Operating at Room Temperature*; Science; Jan. 31, 1997; vol. 275; pp. 649–651.

Hamaker, H.C.; *The London—Van Der Waals Attraction Between Spherical Particles*; Physica IV, Nov. 23, 1937; No. 10; pp. 1058–1072.

Hanafi, Hussein I. et al.; *Fast and Long Retention–Time Nano–Crystal Memory*; IEEE Transactions on Electron Devices; Sep. 1996; vol. 45, No. 9; pp. 1553–1558.

Johnson, K.L. et al.; *Surface energy and the contact of elastic solids*; Proc. R. Soc. Lond. A.; 1971; vol. 324; pp. 301–313

Junno, T. et al.; *Controlled manipulation of nanoparticles with an atomic force microscope*; Appl. Physl. Lett, American Institute of Physics; Jun. 26, 1995; vol. 66, No. 26; pp. 3627–3629.

Kanemitsu, Yoshihiko; *Excitons in silicon quantum structures*; Journal of Luminescence 83–84; 1999; pp. 283–290.

Lai, S.K. et al.; *Design of an $E^2Prom$ Memory Cell Less Than 100 Square Microns Using 1 Micron Technology*; IEDM; 1984; pp. 468–471.

Leff, Daniel V. et al.; *Thermodynamic Control of Gold Nanocrystal Size: Experiment and Theory*; J. Phys. Chem; 1995; vol. 99; pp. 7036–7041.

Littau, K.A. et al.; *A Luminescent Silicon Nanocrystal Colloid via a High–Temperature Aerosol Reaction*; 1993; vol. 97; pp. 1224–1230; J. Phys. Chem.

Martin, Yves et al.; *High–resolution capacitance measurement and potentiometry by force microscopy*; Appl. Phys. Lett, American Institute of Physics; Mar. 28, 1988; vol. 52, No. 13; pp. 1103–1105.

Murray, C.B. et al.; *Synthesis and Characterization of Nearly Monodisperse CdE (E=S, Se, Te) Semiconductor Nanocrystallites*; J. Am. Chem. Soc. 1993; vol. 115, pp. 8706–8715.

Ostraat, Michele L. et al.; *Ultraclean Two–Stage Aerosol Reactor for Production of Oxide–Passivated Silicon Nanoparticles for Novel Memory Devices*; Journal of The Electrochemical Society; 2001; vol. 148, No. 5; pp. G265–G270.

Otobe, Masanori et al.; *Observation of the single electron charging effect in nanocrystalline silicon at room temperature using atomic force microscopy*; Applied Physics Letters, American Institute of Physics; Mar. 2, 1998; vol. 72, No. 9; pp. 1089–1091.

Ramachandran, T.R. et al.; *Direct and controlled manipulation of nanometer–sized particles using the non–contact atomic force microscope*; Nanotechnology; 1998; vol. 9; pp. 237–245.

Schaadt, D.M. et al.; *Charge storage in Co nanoclusters embedded in $SiO_2$ by scanning force microscopy*; Applied Physics Letters, American Institute of Physics; Jan. 18, 1999; vol. 74, No. 3; pp. 472–474.

Tiwari, Sandip et al.; *A silicon nanocrystals based memory*; Appl. Phys. Lett., American Institute of Physics; Mar. 4, 1996; vol. 68; No. 10; pp. 1377–1379.

Tiwari, Sandip et al.; *Single charge and confinement effects in nano–crystal memories*; Appl. Phys. Lett., American Institute of Physics; Aug. 26, 1996; vol. 69, No. 9; pp. 1232–1234.

Tiwari, Sandip et al.; *Volatile and Non–Volatile Memories in Silicon with Nano–Crystal Storage*; IEEE; 1995; pp. 20.4.1–20.4.4.

Wu, Jin Jwang et al.; *A Method for the Synthesis of Submicron Particles*; Langmuir; 1987; vol. 3, pp. 266–271.

Yano, Kazuo et al.; *Room Temperature Single–Electron Memory*; IEEE Transactions on Electron Devices; Sep. 1994; vol. 41, No. 9; pp. 1628–1638.

Zhang, Shou–Hua et al.; *Radial Differential Mobility Analyzer*; Aerosol Science and Technology; 1995; vol. 23; pp. 357–372.

Zhang, Shou–Hua et. et al.; *Resolution of the Radial Differential Mobility Analyzer for Ultrafine Particles*; J. Aerosol Sci.; 1996; vol. 27, No. 8; pp. 1179–1200.

Zhong, Q. et al.; *Fractured polymer/silica fiber surface studied by tapping mode atomic force microscopy*; Surface Science Letters; 1993; vol. 290; pp. L688–L692.

\* cited by examiner

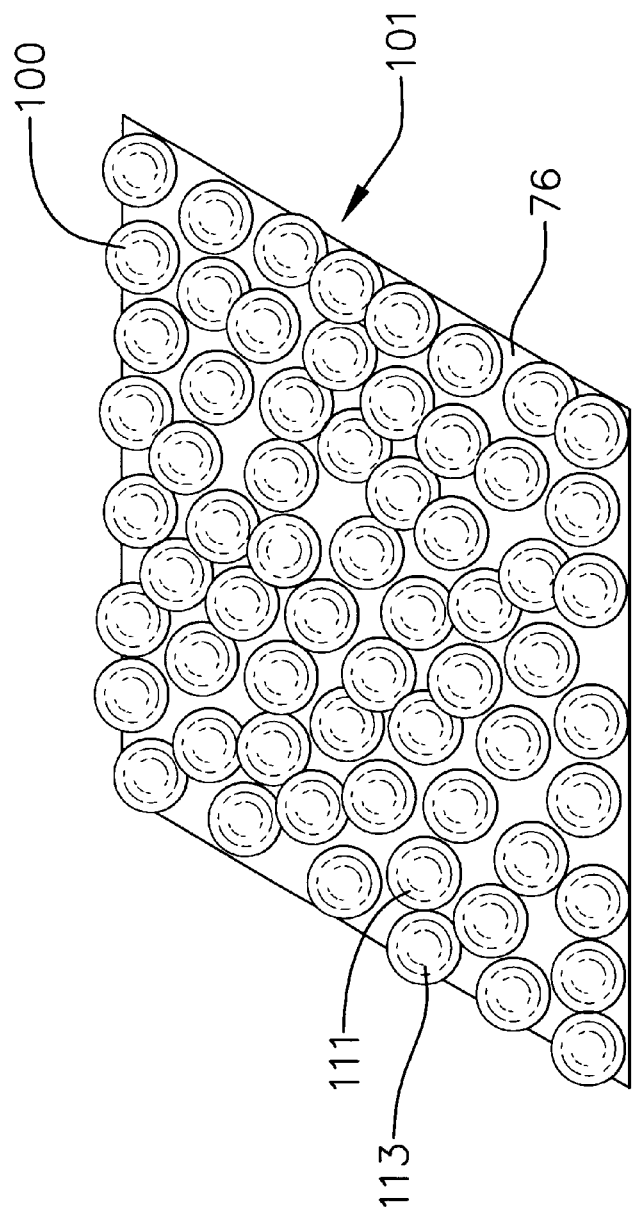
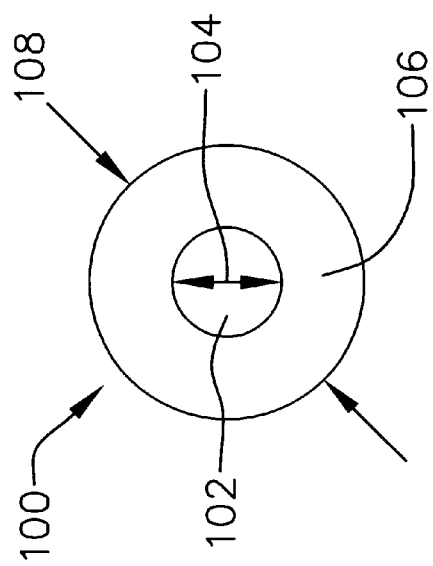
FIG. 6
FIG. 7

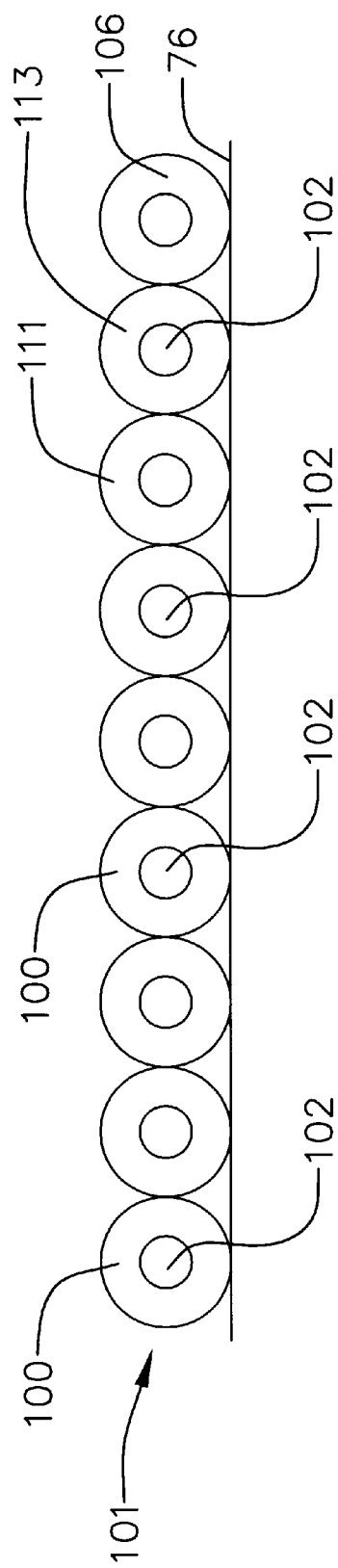
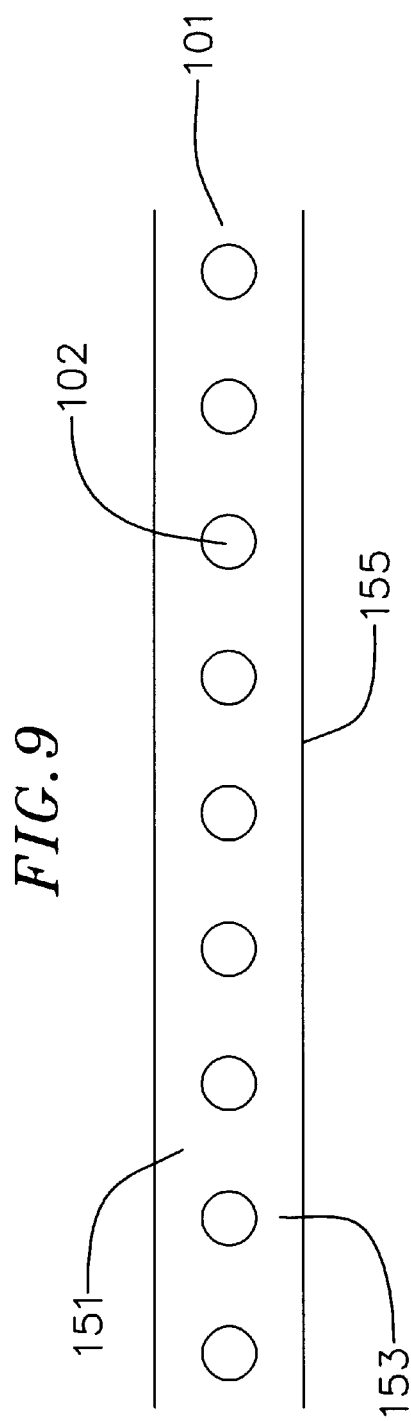

SUBTHRESHOLD CHARACTERISTICS OF A 0.2μm
n-TYPE AEROSOL-NANOCRYSTAL FLOATING-GATE
MOSFET(SUBTHRESHOLD SLOPE=200mV/dec;DIBL=100mV/V)

OUTPUT CHARACTERISTICS OF A 0.2μm AEROSOL-NANOCRYSTAL FLOATING-GATE MOSFET; DRIVE CURRENT=30μA/μm

PROGRAMMING TRANSIENTS (UNIFORM FN TUNNELING) OF THE NANOCRYSTAL NVM DEVICE

ENDURANCE CHARACTERISTIC; ONLY LIMITED WINDOW CLOSURE IS OBSERVED AFTER $10^5$ PROGRAM/ERASE CYCLES

P: $V_g = 8V$; $V_{sub} = -5V$; $t_p = 50\mu s$
E: $V_g = -8V$; $V_{sub} = 8V$; $t_E = 100ms$

FIG. 17
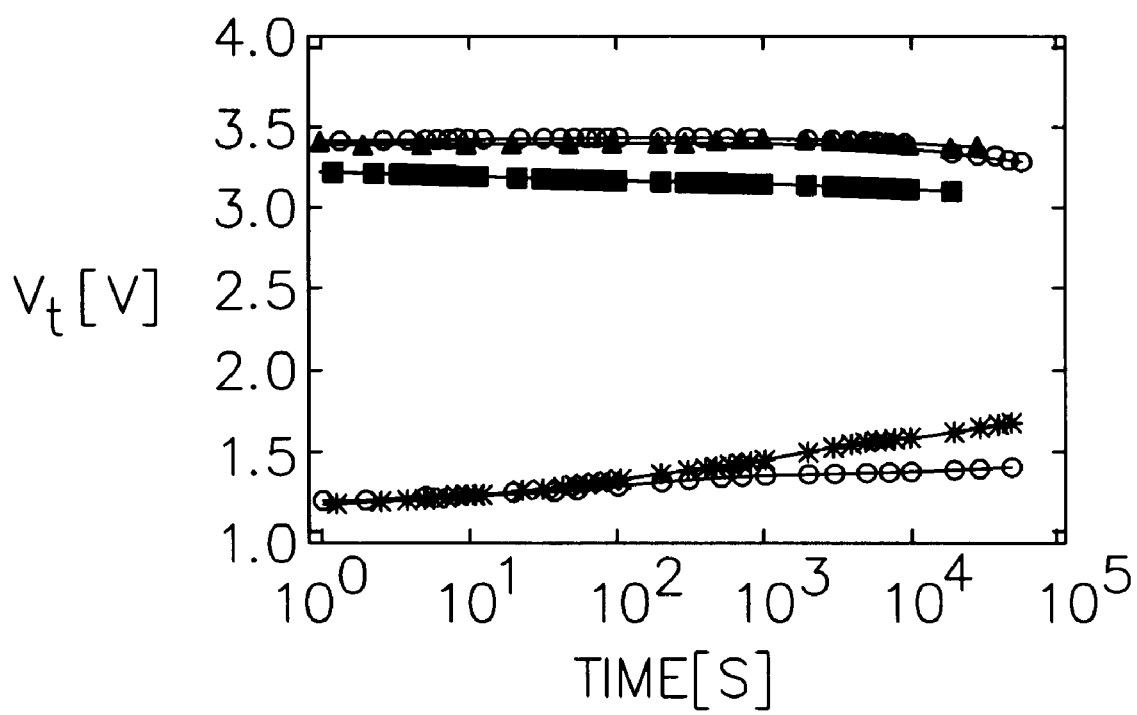
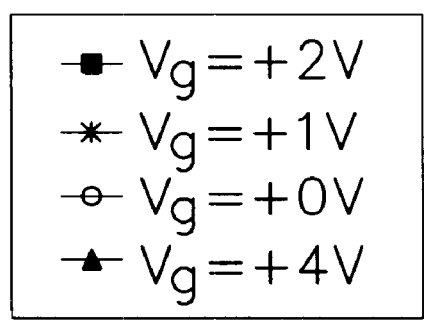

AEROSOL SILICON NANOPARTICLES FOR USE IN SEMICONDUCTOR DEVICE FABRICATION

RELATED APPLICATIONS

This application claims priority of U.S. provisional application serial No. 60/215,390, entitled AEROSOL PROCESS FOR FABRICATING DISCONTINUOUS FLOATING GATE MICROELECTRONIC DEVICES, filed on Jun. 29, 2000, and U.S. provisional application serial No. 60/215,400, entitled DISCONTINUOUS FLOATING GATE INCORPORATING AEROSOL NANOPARTICLES, filed on Jun. 29, 2000.

This application is related to U.S. application Ser. No. 06/215,390, entitled AEROSOL PROCESS FOR FABRICATING DISCONTINUOUS FLOATING GATE MICROELECTRONIC DEVICES, filed on Jun. 29, 2001.

STATEMENT REGARDING FEDERALLY SPONSORED RESEARCH OR DEVELOPMENT

The U.S. Government has certain rights in this invention pursuant to grant DMR-9871850 awarded by the National Science Foundation.

BACKGROUND OF THE INVENTION

Driven by a strong demand for portable electronic devices, non-volatile memory represents an important and rapidly growing sector of today's semiconductor memory market. Polysilicon floating gate memory devices conventionally have held the largest market share of non-volatile memory devices. In today's rapidly emerging non-volatile memory device sector, non-volatile floating gate memory devices have been fabricated by embedding silicon nanoparticles within the gate oxide of metal-oxide semiconductor field effect transistors (MOSFETs). Nanoparticles are so named because they include particle diameters on the nanometer scale. It is believed that silicon nanoparticle floating gate memory devices outperform conventional floating gate memory devices with faster read and write times, higher reliability, and lower power dissipation. The memory operation of nanoparticle field effect transistors depends on charge storage, similar to conventional non-volatile memory devices. In a nanoparticle non-volatile memory device, however, charge is not stored on a continuous floating gate polysilicon layer as in the conventional technology, but instead on a layer of discrete, preferably crystalline silicon nanoparticles which may alternatively be referred to as nanocrystals or quantum dots.

In these nanoparticle floating gate memory devices, the nanoparticles that act as charge storage elements are located within the gate oxide of a MOSFET. Injecting charge into the nanoparticles by tunneling from the channel alters the threshold voltage of the transistor. A normal write/read/erase cycle includes information being written by injecting charge from the channel into the nanoparticles, reading by measuring the subthreshold current-voltage characteristics, and erasing by removing charge from the particles to the channel. A single electron stored on each nanoparticle in an array with a nanoparticle density of $3$–$10 \times 10^{11}/cm^2$ results in a threshold voltage shift of 0.3–0.5 volts that is easily detected at room temperature. Generally speaking, as compared to conventional stacked-gate non-volatile memory devices, nanoparticle charge-storage offers several potential advantages, such as: (1) simple, low cost device fabrication since a dual-polysilicon process is not required; (2) superior retention characteristics resulting from Coulomb blockade and quantum confinement effects, enabling the use of thinner tunnel oxides and lower operating voltages; (3) improved anti-ppunchthrough performance due to the absence of drain-to-floating gate coupling thereby reducing drain induced punchthrough, allowing higher drain voltages during readout, shorter channel lengths and consequently a smaller cell area; and (4) excellent immunity to stress induced leakage current (SILC) and defects, due to the distributed nature of the charge storage in the nanocrystal layer. Even if a significant fraction of the individual nanocrystals that form the floating gate, are shorted to the channel/substrate, the non-volatile memory device remains functional because the non-shorted nanocrystals continue to store sufficient charge. The switching speed of devices made of nanocrystal ensembles, however, is potentially limited by a distribution in charge transit times, charging voltages, and threshold shifts resulting from various shortcomings of the nanoparticle layer, such as the nanoparticle size and size distribution, nanoparticle density, layer planarity and uniformity, and nanoparticle-to-nanoparticle interaction, i.e., lateral conduction.

Thus, there is a demonstrated need in the art for a layer of nanoparticles of uniform size distribution and density. Similarly, there is a demonstrated need for fabricating silicon or silicon-compatible nanocrystals with controlled size distributions and oxide thicknesses that can be deposited on a substrate in a uniform and co-planar manner. It is also desirable to fabricate the layer of nanocrystals using a process sequence that is simple, reliable, low cost, easily controlled, repeatable, and free of contamination. Previous attempts at producing a layer of nanocrystals suitable for use in a field-effect transistor or other non-volatile memory devices, include the shortcomings of uncontrolled particle sizes, non-uniformity of particle deposition, high contamination levels, low density of the particle material, non-uniform density of the particles within the nanoparticle layer, and unpredictable planarity of the nanoparticle layer. Such irregular and unpredictable nanocrystal layers result in poor-performing or non-functional devices.

In conclusion, in order to produce non-volatile memory devices with faster read and write times, higher reliability and lower power dissipation, it is desirable to provide a contamination-free monolayer of nanocrystals of uniform density and particle size for use in floating-gate non-volatile memory devices.

SUMMARY OF THE INVENTION

To address these and other needs and in view of its purposes, the present invention provides a stratum of discrete particles, each including a crystalline core surrounded by a continuous dielectric shell. The particles of the stratum include a tightly controlled range of particle sizes in the nanometer range. The cores of the particles include a density which approaches the bulk density of the material of which the cores are formed. A majority of the particle cores are single crystalline. Adjacent semiconductor particles of the stratum are electrically insulated from each other by means of their dielectric shells. The stratum may be used to form various semiconductor and microelectronic devices.

According to one aspect of the present invention, the stratum is used to form the floating gate of a transistor which additionally includes a tunnel oxide formed beneath the stratum and an upper gate oxide formed above the stratum. In one embodiment, the transistor may include a stratum of discrete silicon nanoparticles arranged in a monolayer and in which at least 90% of the nanoparticles include a diameter of less than 10 nanometers. Adjacent semiconductor particles of the stratum are electrically insulated from each other.

According to another aspect of the present invention, the stratum used to form the floating gate of a transistor includes nanoparticles having cores which include a density that approaches the bulk density of the material of which the cores are formed and in which a majority of the cores are single crystalline

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features and the relative dimensions and locations of the features are arbitrarily expanded or reduced for clarity. Like numerals denote like features throughout the specification and drawing. Included in the drawing are the following figures.

FIG. 6 is a cross-sectional view of an exemplary semiconductor nanoparticle of the present invention;

FIG. 7 is a perspective view showing a stratum of semiconductor nanoparticles formed on a surface according to the present invention;

FIG. 8 is a cross-sectional view of a stratum of semiconductor nanoparticles formed according to the present invention;

FIG. 9 is a cross-sectional view showing a stratum of semiconductor nanoparticles of the present invention interposed between exemplary oxide layers;

FIG. 17 is a graph showing retention and disturb characteristics of an exemplary MOSFET formed to include a floating gate formed of the exemplary silicon nanocrystals of the present invention.

DETAILED DESCRIPTION OF THE INVENTION

Figure 1:
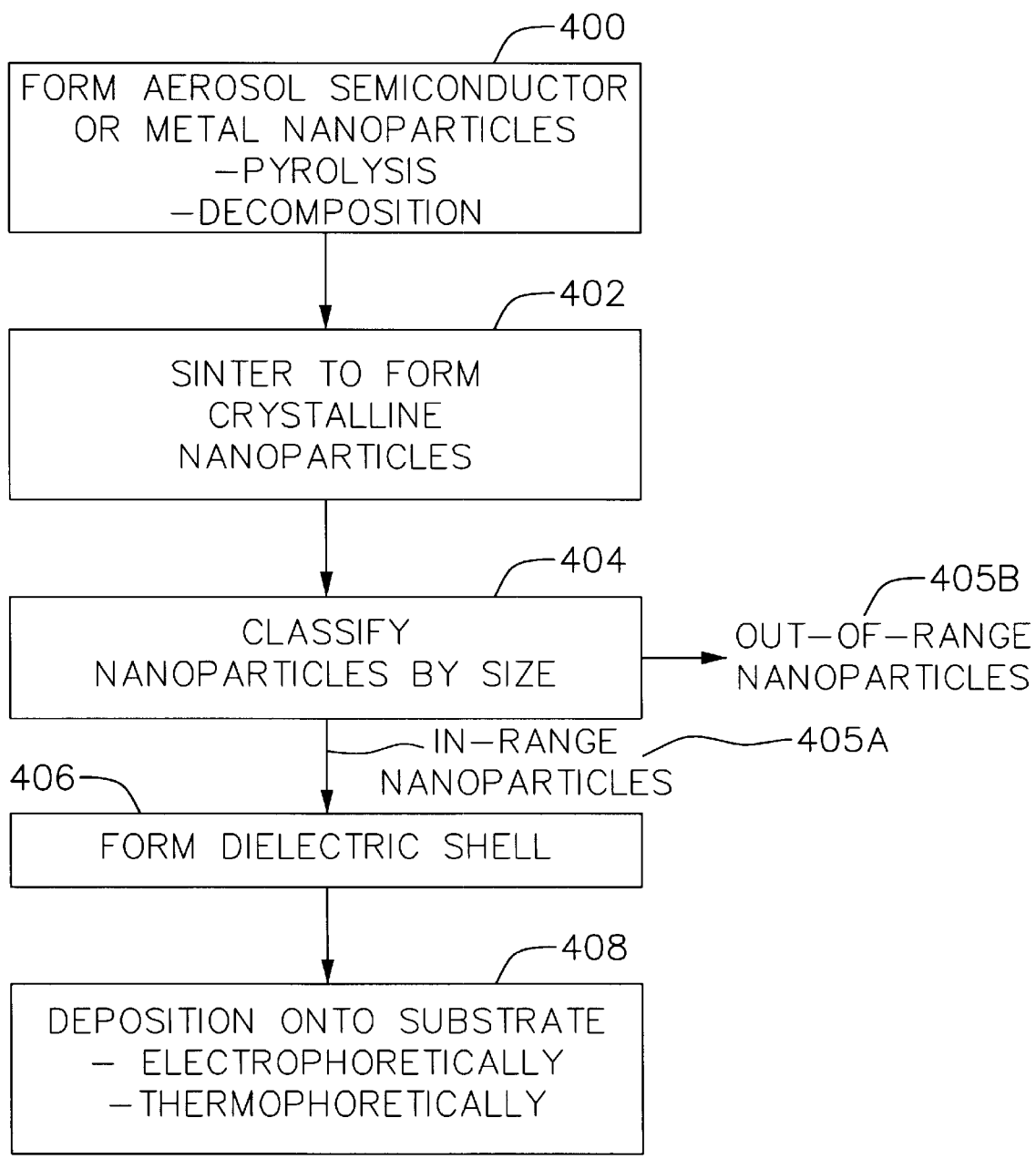
FIG. 1 is a flow chart of an exemplary process sequence of the present invention.

The present invention provides an aerosol-nanocrystal floating-gate field effect transistor suitable for non-volatile memory applications. More particularly, the present invention provides a stratum of semiconductor nanocrystals suitable for use as the floating gate of a floating gate transistor as well as for other applications in various semiconductor and microelectronic devices. The stratum is a semiconductor device which may be characterized as a discontinuous floating gate when used as the floating gate of a transistor. The stratum includes a plurality of crystalline semiconductor nanoparticles preferably arranged in a monolayer. The nanocrystals are so named because they include diameters in the nanometer range. The particles are formed of a crystalline core and dielectric shell. The dielectric shell preferably forms a continuous cover which encapsulates the core. In a preferred embodiment, both the particles and cores are substantially spherical. The majority of particles include cores which are formed of a single crystalline material. The cores are characterized by a density which approaches the bulk density of the material of which they are formed. The bulk density of a material is the maximum density of the material at standard temperature and pressure (STP) conditions. The crystalline core is preferably formed of silicon or materials compatible with silicon processing. The stratum is characterized by a tightly controlled particle size distribution and a particle density ranging from $10^{12}$ to $10^{13}$ particles/centimeter. The stratum, or layer of nanoparticles, may include a significant portion of adjacent nanoparticles contacting one another. The dielectric shell formed around each particle electrically isolates particle cores from one another and precludes lateral shorting between even adjacent particles. A non-volatile memory device formed to include a stratum of the aerosol-nanoparticles is characterized by program/erase characteristics comparable to conventional stacked gate non-volatile memory devices, excellent endurance of greater than $10^5$ program/erase cycles and long-term non-volatility even when used in conjunction with a thin, lower gate or, tunnel oxide.

The particles may be used in various other semiconductor and microelectronic device applications. In various exemplary embodiments, multiple strata may be formed. According to another exemplary embodiment, the particles may be arranged in an ordered structure on the substrate, such as a wire.

The nanoparticles may be formed as an aerosol and may preferably be sintered to convert the particles to dense crystalline material, and to preclude the formation of undesirable agglomerates of large particles. An aspect of the present invention is the controlled size distribution of the produced crystalline nanoparticles, the densified nature of the nanoparticles, and that the majority of nanoparticles include a single-crystalline structure. The nanoparticles within the aerosol may advantageously be classified according to size such that the distribution of particle sizes is tightened further.

Another aspect of this invention is a stratum of metallic nanoparticles consisting of metallic cores and dielectric coatings. The metallic nanoparticles are substantially similar to the semiconductor nanoparticles described above, except that the core materials are metal.

Now turning to the figures, FIG. 1 shows an exemplary flow chart of the process of the present invention. At step 400, an aerosol of semiconductor or metal nanoparticles is formed by pyrolysis or other decomposition methods. At step 402, the nanoparticles contained within the aerosol are sintered to form crystalline material. At optional step 404, the crystalized nanoparticles are classified by size. Nanoparticles which fall outside of a pre-selected range of particle sizes, are removed at 405B. The in-range nanoparticles are next delivered for dielectric coating at 405A. At step 406, the nanoparticles are oxidized to form an oxide shell over the nanoparticles, and at step 408 the nanoparticles of the aerosol are deposited on the substrate.

For brevity, the following detailed description will refer to the nanoparticles as semiconductor nanoparticles, but it should be understood that the following description applies to metal nanoparticles as well. With respect to embodiments specifically applicable to metal nanoparticle formation and constitution, such will be pointed out.

Figure 2:
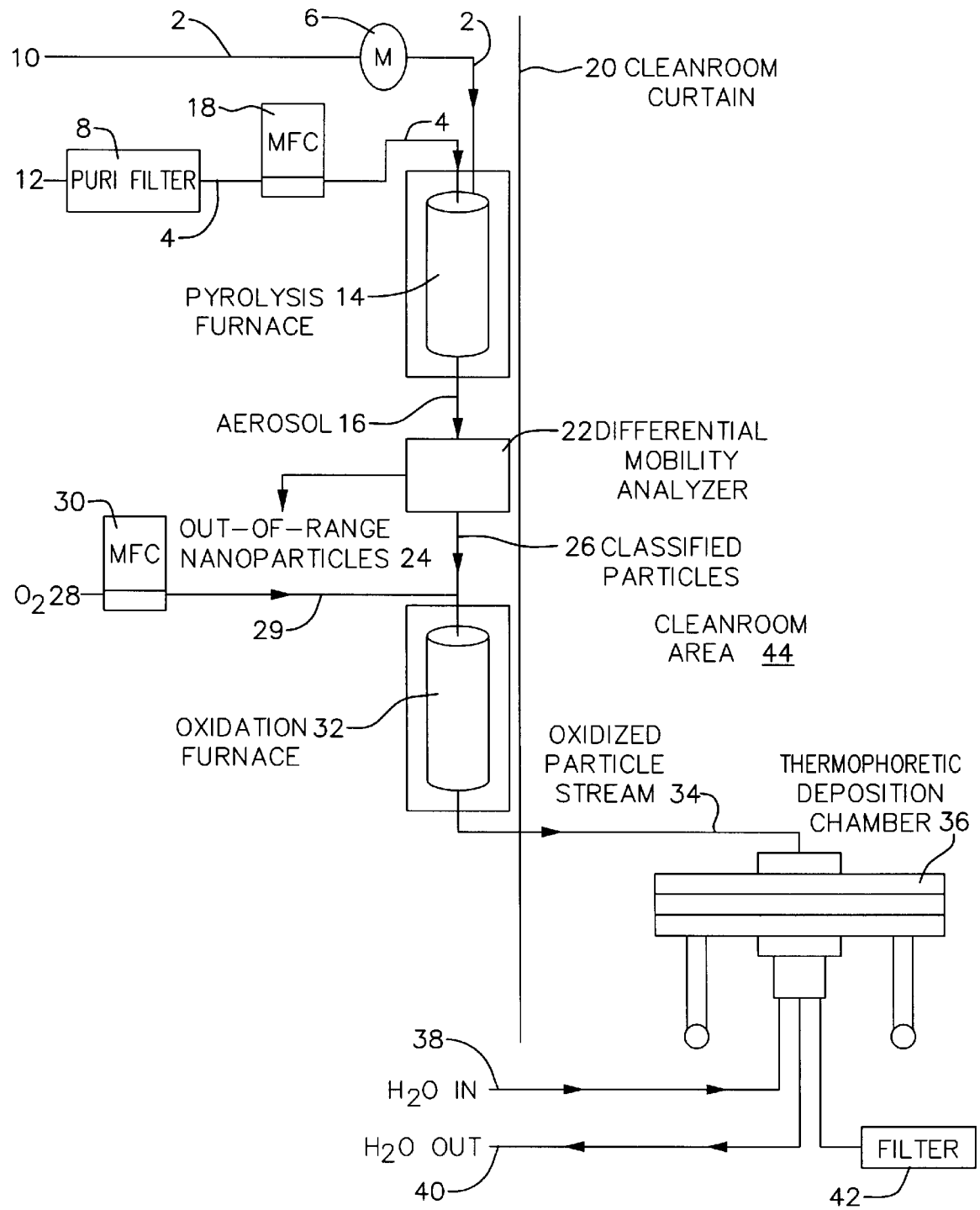
FIG. 2 is a schematic of an exemplary processing system of the present invention.

FIG. 2 shows a schematic of an exemplary arrangement of processing equipment used to carry out the generalized process flow shown in FIG. 1. The arrangement shown in FIG. 2 is exemplary only as other and additional equipment may be used to carry out the process according to the present invention. In the exemplary embodiment shown in FIG. 2, pyrolysis furnace 14, differential mobility analyzer 22 and oxidation furnace 32 are shown to be positioned outside of clean room area 44 while deposition chamber 36 is shown to be positioned within clean room area 44. Such arrangement is exemplary only and in alternative embodiments all of the equipment may be included within a clean room environment. In the first step of the exemplary processing operation, a semiconductor material or precursor is decomposed or broken down to form smaller units of semiconductor particles. Various methods for decomposition of the semiconductor material may be used, including gas evaporation, laser ablation, spark ablation, pyrolysis and various other chemical reactions. According to the alternative embodiment in which a metallic material or precursor is used to form metallic nanoparticles, gas evaporation, laser ablation and spark ablation are advantageously utilized. Returning to the exemplary semiconductor embodiment, the decomposition of the semiconductor material produces a plurality of discrete semiconductor nanoparticles, so named because they typically include particle sizes in the nanometer range. The semiconductor material from which the nanoparticles are made by decomposition, may preferably be silicon but other semiconductor materials and precursors and also other metallic materials and precursors may be used according to alternative embodiments. Materials other than silicon are preferably selected for compatibility with silicon processing. In an exemplary embodiment, a pyrolysis furnace is used to form the plurality of discrete nanoparticles.

Referring to FIG. 2, pyrolysis furnace 14 is fed by particle source gas 2 and diluent gas 4. In an exemplary embodiment, diluent gas source 12 may be nitrogen but other inert species such as helium may be used according to alternative embodiments. In the exemplary embodiment shown, diluent gas 4 is filtered by filter 8 and the diluent gas flow rate is controlled by MFC (mass flow controller) 18. Particle source gas 2 includes the source of semiconductor particles, preferably silicon, and includes a flow rate controlled by valve 6. Particle source gas 2 originates from source 10 and will preferably be a mixture also including a carrier gas. The arrangement shown in FIG. 2 is exemplary only and it should be understood that other gas flow control means may be used. For example, the flow rate of particle source gas 2 may preferably be controlled by an MFC (not shown). In an exemplary embodiment, each of diluent gas 4 and the carrier gas may be nitrogen provided by a single source. The pyrolysis furnace 14 is shown in greater detail in FIG. 3.

Figure 3:
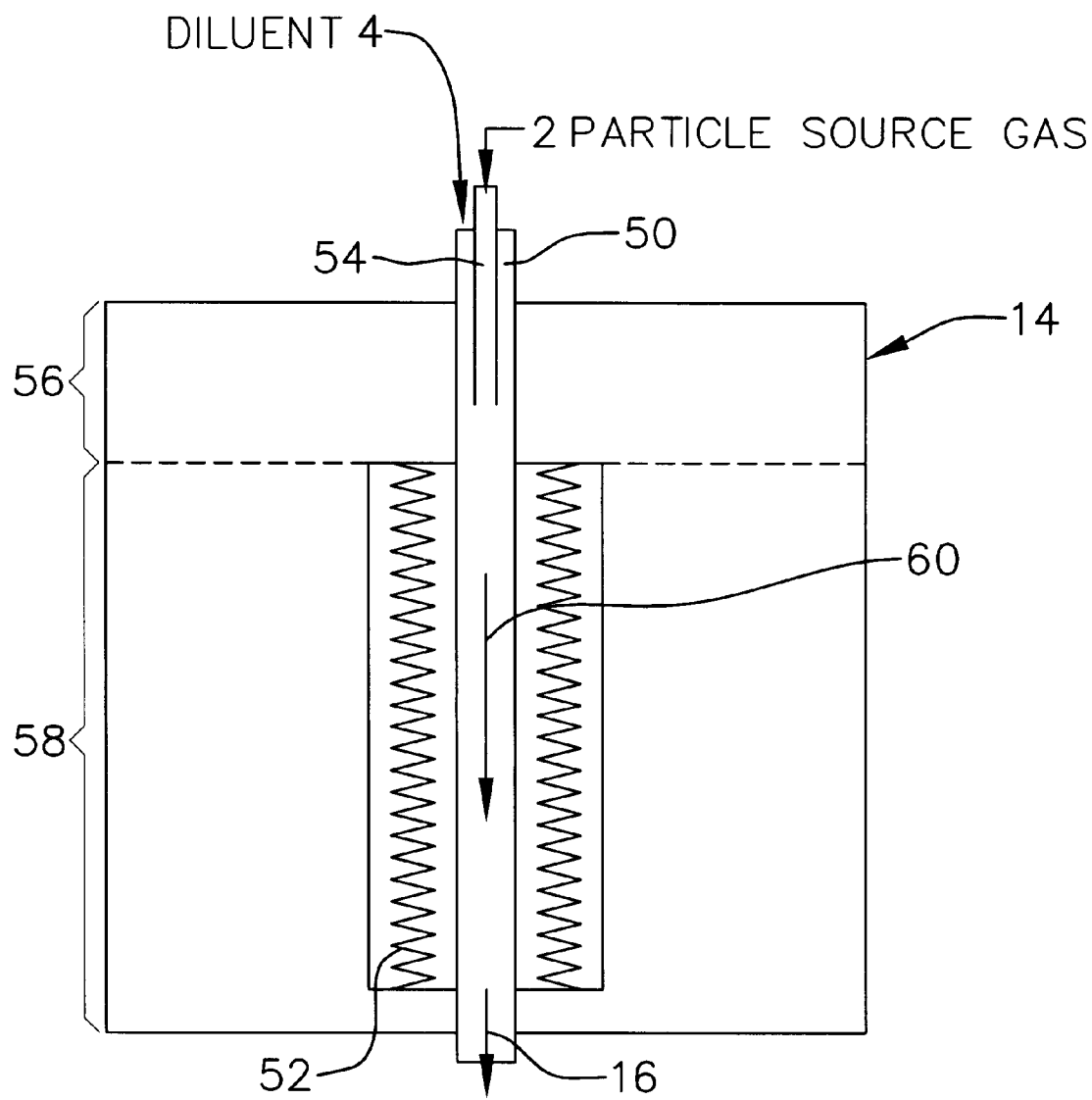
FIG. 3 is a cross-sectional view of an exemplary pyrolysis furnace of the present invention.

Now turning to FIG. 3, particle source gas 2 and diluent gas 4 are each delivered to pyrolysis furnace 14. Particle source gas 2 includes a source from which the semiconductor nanoparticles will be formed. In an exemplary embodiment, particle source gas 2 may include silicon. In an exemplary embodiment, the silicon may be delivered as silane in particle source gas 2. Gaseous silane may be considered a silicon precursor. According to other exemplary embodiments, disilane or other silicon sources may be used alternatively. In an exemplary embodiment, the carrier gas included within particle source gas 2 may be nitrogen, but other inert carrier species may also be used. Diluent gas 4 will be nitrogen in the preferred embodiment, but other inert gases may be used alternatively as the diluent gas. According to one exemplary embodiment, the carrier gas and diluent gas may emanate from the same source. In a preferred embodiment, each of the diluent gas and carrier species may be nitrogen and may be ultrahigh purity (UHP) nitrogen which flows through an oxygen getter, then splits into two flows. One of the flows becomes diluent gas 4 and the other flow serves as the carrier gas and flows along with the semiconductor material in particle source gas 2. In an exemplary embodiment, each of diluent gas 4 and particle source gas 2 may include a flow rate of 750 sccm. According to other exemplary embodiments, the flow rates for each of diluent gas 4 and particle source gas 2 may range from 650–850 sccm, but other flow rates may be used alternatively. According to a preferred embodiment, particle source gas 2 includes 750 sccm of purified nitrogen as a carrier gas in combination with less than 1 sccm of 5000 ppm silane in nitrogen. According to other exemplary embodiments, other dilute mixtures of silane or other dilute mixtures of various other semiconductor source gasses, may be used as particle source gas 2. Pyrolysis furnace 14 includes maximum temperature zone 58 and pyrolysis zone 56. Pyrolysis furnace 14 is heated using conventional heating means 52. The gas flows enter pyrolysis furnace 14 in the entry or pyrolysis region 56 and flow downstream into the maximum temperature zone 58. The flows of each of particle source gas 2 and diluent gas 4 may be delivered to pyrolysis furnace 14 through ⅛" stainless steel tubing, but other tubing may be used according to other exemplary embodiments. Within pyrolysis furnace 14, stainless steel tubing may be used or quartz tubing may be used. In a preferred embodiment, particle source gas 2 is directed to pyrolysis furnace 14 through inner tube 54 which is axially centered within outer tube 50 through which diluent gas 4 enters pyrolysis furnace 14. In a preferred embodiment, the maximum temperature zone of pyrolysis furnace 14 may be maintained at a temperature within the range of 950° C. to 1150° C., and at 1050° C. in the preferred embodiment. Other maximum temperatures may be used alternatively.

In the exemplary embodiment discussed herein, silane gas is the particle source and silicon nanoparticles will be formed. It should be understood, however, that such is exemplary and that other source gases, including other semiconductor or metal materials or precursors, may be used to form other semiconductor or metal nanoparticles according to other exemplary embodiments. Other exemplary source gasses may include GaAs, GaN or p-doped semiconductor precursors.

Silane flow is introduced to pyrolysis furnace 14 as part of particle source gas 2 and flows through pyrolysis zone 56 towards maximum temperature zone 58. The gas is heated in pyrolysis zone 56 during a ramp-up period during which it is heated to the maximum temperature achieved in maximum temperature zone 58. The silane pyrolyzes in the pyrolysis zone and breaks up into a plurality of discrete silicon nanoparticles which form an aerosol. Stated alternatively, the plurality of discrete semiconductor nanoparticles are entrained in a gas. The nanoparticles initially form by homogeneous nucleation and grow by coagulation and vapor deposition. In an exemplary embodiment, particle growth occurs during the ramp-up period during which the gas is heated to the maximum temperature it achieves in the maximum temperature zone. In an exemplary embodiment, particle growth occurs during a ramp-up period ranging from 10–50 milliseconds, preferably 30 milliseconds. Gas flow rates are chosen in conjunction with tubing size and length of the pyrolysis zone to achieve a residence time of chosen duration in the pyrolysis zone. During the ramp-up time within pyrolysis zone 56 of pyrolysis furnace 14, the silane pyrolyzes to form an aerosol of silicon nanoparticles. Also during the ramp-up time within pyrolysis zone 56 and before particle source gas 2 reaches maximum temperature zone 58, a diluent stream preferably of UHP nitrogen combines in an annular flow around the aerosol particle flow, upstream from the maximum temperature zone, to reduce particle concentration and suppress particle coagulation. An exemplary arrangement shown in FIG. 3 includes diluent gas 4 entering through outer tube 50 to quench particle source gas 2 which enters through inner tube 54, but other arrangements for mixing the respective gasses may be used alternatively. Silicon aerosol particles with diameters ranging from 3–50 nanometers are produced by controlling the flow rate of the dilute silane and the flow rates of the quenching ultrahigh purity nitrogen or other gases. In a preferred embodiment, the diameters of each of the particles may be less than 20 nanometers. The annular quenching flow also suppresses particle deposition onto the tube walls and therefore reduces contamination. The flow of the gas mixture of the diluent gas and particle source gas 2 continues in the maximum temperature zone 58.

Within maximum temperature zone 58, the silicon nanoparticles are sintered so that they preferably become dense, spherical, single crystal nanoparticles. According to another exemplary embodiment, the densified nanoparticles may become polycrystalline particles. Flow conditions are chosen such that the sintering time may range from 200–600 milliseconds, preferably 400 milliseconds. During this densification/sintering process, it is essential that the reactor environment be oxygen-free since oxygen will cause the formation of silicon oxides rather than crystalline silicon. Additionally, oxygen prevents the desirable sintering of silicon nanoparticles. The sintering is carried out in a controlled fashion to suppress uncontrolled coagulation of the particles and therefore to maintain the size distribution of the particles within a tight range. During this sintering process, the particles are heated to a sufficiently high temperature to density the particles to form highly compacted particles, and to crystallize the particles. The densified, discrete particles are formed to have a density which is substantially as great as the bulk density of the pure semiconductor material of which they are formed. The bulk density of a material is the maximum density of the material at standard temperature and pressure (STP) conditions. Moreover, a majority of the densified particles will be single crystalline material. In a preferred embodiment, all of the densified particles will be single crystalline material. Also in the preferred embodiment, the densified particles will be generally spherical in shape. Aerosol stream 16, which includes the silicon nanocrystals, exits pyrolysis furnace 14. According to another exemplary embodiment in which single crystalline particles are not needed, the sintering process may be bypassed. After the sintering process, particle diameters may range from 3–50 nanometers, preferably less than 20 nanometers.

Once formed and sintered, the densified silicon nanoparticles or nanocrystals of the aerosol may advantageously be charged and classified by a size. The classification may be accomplished by time-of-flight separations of a focused particle beam. FIG. 2 shows aerosol stream 16 being delivered to an exemplary differential mobility analyzer (DMA) 22 used to classify the nanoparticles. Aerosol stream 16 may optionally be cooled prior to classification, using conventional means. Within DMA 22, the nanoparticles within the aerosol are separated and out-of-range nanoparticles are removed from the DMA 22 in out-of-range nanoparticle stream 24, while classified particles within a pre-selected range of sizes continue to flow in stream 26 for additional processing. DMA 22 is shown in greater detail in FIG. 4.

To positively charge the nanoparticles for classification, they may be passed through a so-called aerosol neutralizer prior to delivery to DMA 22. In the aerosol neutralizer, the particles are exposed to an ambipolar cloud of gas ions produced by a Kr source, in an exemplary embodiment. During this process, a small fraction of the nanoparticles become charged with most carrying a single charge. Other devices for charging the nanoparticles may be used for classification, particularly ones that change a larger fraction of the particles.

Figure 4:
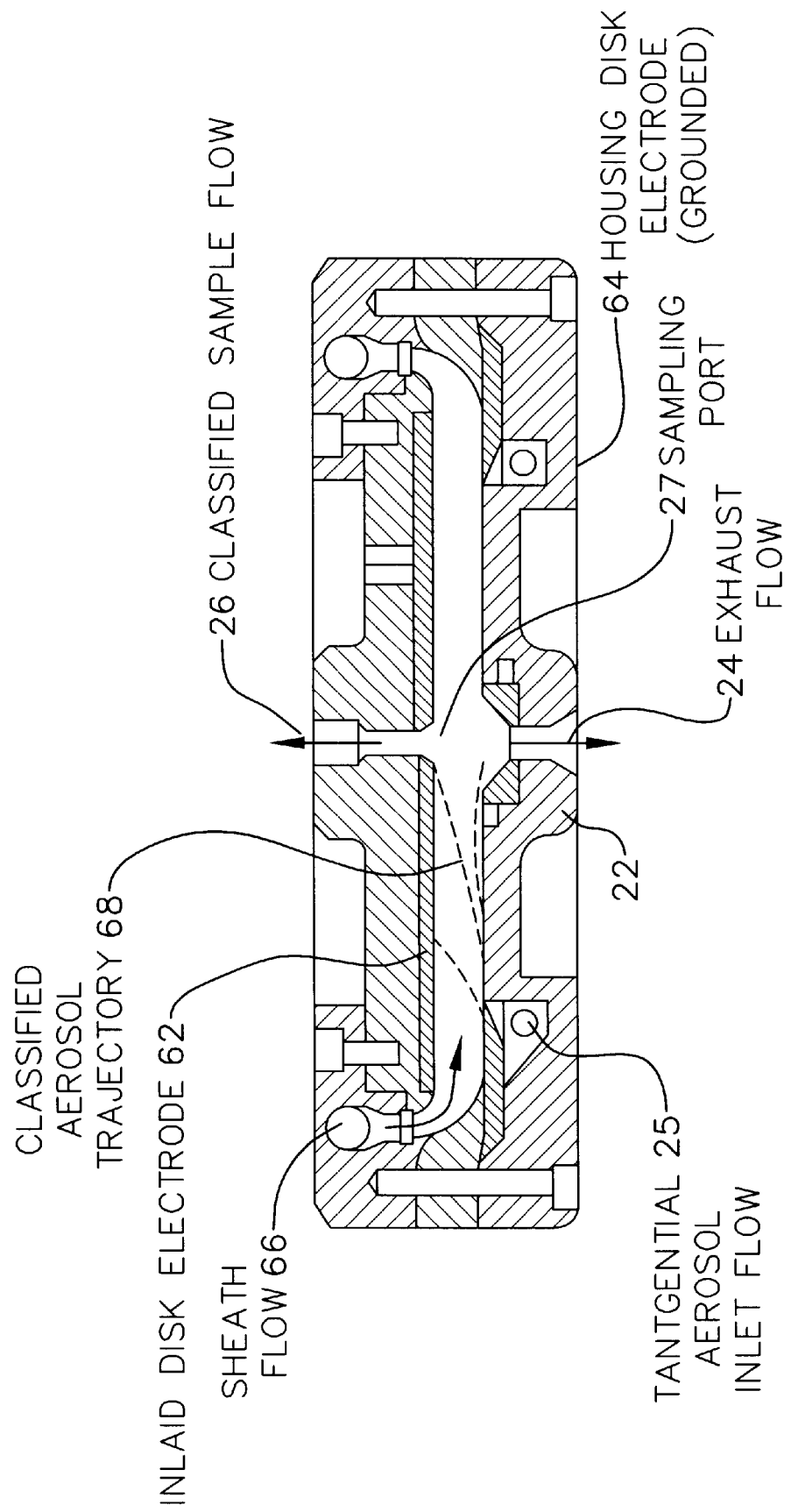
FIG. 4 is a cross-sectional view of an exemplary radial differential mobility analyzer used to classify nanoparticles in the present invention.

Now turning to FIG. 4, radial DMA 22 is a parallel-plate capacitor with radial symmetry in an exemplary embodiment. According to other exemplary embodiments, DMA 22 may take on other configurations. Generally speaking, an electric field is applied to the plates of the differential mobility analyzer 22 to separate the charged nanoparticles and to allow for particles having diameters within a pre-selected range of particle sizes, to exit DMA 22 and continue processing. In the exemplary embodiment shown, an electric field is applied across electrodes 62 and 64. Particle separation occurs due to electromigration of particles within DMA 22. The desired, pre-selected particle range may vary according to various exemplary embodiments. Positively charged nanoparticles within aerosol stream 16 enter DMA 22 tangentially, through aerosol inlet port 25 and migrate radially inward along a particle-free laminar sheath flow 66 in the presence of an applied negative electric field. Ideally, the nanoparticles carry only one elementary charge, and since these entering particles are generally spherical, their mobility is related to their diameter. Nanoparticles with different sizes follow different trajectories 68 within DMA 22. At the center of DMA 22 is sampling port 27 through which the classified nanoparticles within the pre-selected size range, are removed. Uncharged nanoparticles and nanoparticles with sizes larger than the classified size exit DMA 22 with an excess flow as part of exhaust flow 24. Particles which are smaller than the classified particles in the pre-selected range deposit on the bottom electrode of DMA 22. The diameter of the nanoparticles which are transmitted in classified sample flow 26 is controlled and determined by flow rates and the applied voltage.

The particle concentration within the aerosol stream can be monitored throughout the synthesis process by flowing a portion of the classified aerosol flow into an electrometer with femtoampere sensitivity. By varying the voltage applied to DMA 22 and detecting the particle concentration from the electrometer read downstream from DMA 22, for example, the particle size of the silicon nanoparticles exiting the furnace can be measured.

In an exemplary embodiment, particle diameters may be chosen to lie within the range of 2–10 nanometers, but other ranges such as 2–6 nanometers, 3–7 nanometers, 5–10 nanometers, or less than 15 nanometers, may be chosen alternatively. In another exemplary embodiment, nanoparticles within the 1 to 10 nanometer diameter size range may be classified within about 6% on diameter. According to another exemplary embodiment, the nanoparticles may be classified such that 90% of the particles are within the desired range.

In cases where a thermal oxide passivating layer is desired, classified particle flow 26 is next delivered to oxidation furnace 32 along with oxygen stream 29 as shown in FIG. 2. Oxygen source 28 and therefore oxygen flow 29 may be controlled by MFC 30 and include an oxygen concentration of 20% oxygen in nitrogen in an exemplary embodiment. Oxidation may occur as the silicon nanoparticle aerosol is combined with a controlled flow of oxygen or the silicon nanoparticle aerosol may be flowed through a water evaporator. According to yet another exemplary embodiment, oxidation may take place using TEOS (tetraethyl orthosilicate). According to still other exemplary embodiments, dielectric or insulating layers other than an oxide may be formed to coat the individual nanoparticles to insure that the individual nanoparticles are electrically isolated from one another. The insulating-layer coated particles are preferably encapsulated by the insulating-layer coating.

In the oxidation furnace/oxygen flow embodiment shown in FIG. 2, since the silicon nanoparticles are produced in ultra high purity nitrogen, the oxygen flow rate can be changed to alter the concentration of oxygen in the final oxygen/nitrogen mixture. Various oxygen flow rates may be used. The oxidation temperature within oxidation furnace 32 can also be varied. Typical oxidation furnace temperatures lie in the range of 700–1100° C. with residence times of 200–800 milliseconds. Oxidation temperatures within oxidation furnace 32 are chosen in this range because lower temperatures produce poorer quality oxides, whereas higher temperatures have the tendency to evaporate silicon dioxide that is formed on the surface of the silicon nanoparticles. During the oxidation process which may occur at 900° C. in an exemplary embodiment, a thermal oxide shell forms on the exposed silicon surface of the silicon nanoparticles, partially consuming the outer silicon material during the reaction. The thickness of the oxide shell is controlled by controlling the residence time of the aerosol within oxidation furnace 32. In general, a longer residence time increases oxide shell thickness. Oxide shell thicknesses typically range from 1–10 nanometers, and in a preferred embodiment may be controlled within the range of 1.5–2.0 nanometers. The thermal oxidation process is a uniform process which consumes the silicon surface of the preferably crystallized silicon nanoparticles thereby reducing the "core" size of the silicon nanoparticle. After oxidation, the silicon nanoparticles preferably include a crystalline silicon core having a diameter uniformly reduced with respect to the diameter of the silicon particle prior to oxidation. The silicon nanoparticle also includes an oxide shell surrounding the silicon core. This will be shown in FIG. 6.

According to another exemplary embodiment, other materials such as water can be used to oxidize the silicon nanoparticles in a hot tube furnace, a process known as steam oxidation. According to this embodiment, the aerosol of silicon nanoparticles flows through a water evaporator (not shown) maintained at a controlled but variable temperature to control the amount of water allowed into the oxidation furnace. The water concentration can be controlled by varying the aerosol flow rate through the water evaporator. After the water evaporator, the aerosol and water are flowed through a high temperature oxidation furnace where the particles become oxide passivated at temperatures of 700° C.–1000° C.

According to yet another exemplary embodiment, the silicon nanoparticles may be coated with silica by chemical vapor deposition using TEOS (tetraethyl orthosilicate) or other $SiO_2$ precursors such as TMOS (tetramethyl orthosilicate). Using the TEOS oxidation process, the particle core size is not reduced as silicon material is not consumed during the deposition of a silicon dioxide film onto the classified silicon nanoparticles using TEOS as the precursor. The deposition process allows the possibility of producing oxide-passivated silicon nanoparticles while retaining the silicon core diameter such that it will not differ significantly from the original classified core diameter. To produce silicon nanoparticles which are uniformly coated with a silicon dioxide film, temperatures below about 750° C. are used. In an exemplary embodiment, using oxidation temperatures ranging from 500° C. to 700° C., an oxide thickness of about 0.6 nm is uniformly deposited on the particles. Under certain circumstances, the TEOS does not form a uniform layer around the particle, rather, the TEOS does not wet the silicon surface and, thus, balls up on the particle surface. When introduced into the oxidation furnace, the TEOS ball then reacts to produce silicon dioxide and the final particle morphology is the originally classified silicon nanoparticle with a silicon dioxide particle attached to its surface. To prevent this undesirable particle morphology, it is necessary to pre-treat the silicon nanoparticle surface. One pre-treatment method is to expose the nanoparticle aerosol to ethanol vapor but other materials such as methanol or isopropanol may be used in other exemplary embodiments. This involves flowing the aerosol through an ethanol evaporator maintained at a constant temperature to control the amount of ethanol introduced into the aerosol flow. This pre-treatment technique has been found to be particularly advantageous for TEOS oxide passivation performed at temperatures below about 500° C.

According to other exemplary embodiments, other chemical vapor deposition methods and other methods for causing the surface of the nanoparticles to react with a gas may be used. Various dielectric or insulating layers may be formed substantially continuously over the nanoparticle surface, thereby forming a dielectric shell of sorts.

After the silicon nanocrystals have preferably been coated with a dielectric coating according to one of the exemplary methods, the particles are collected for subsequent use in device fabrication. According to one exemplary embodiment, the particles may be directly deposited onto a device substrate and, according to another exemplary embodiment, the particles may be collected in liquid for subsequent colloidal processing. The former approach has the advantage of minimizing potential contamination and ease of interfacing with the scanning probe microscope and other dry manipulation techniques. The latter approach offers the potential to use colloidal forces to assist in the assembly of the classified, passivated silicon nanoparticles into the desired device structures. Several techniques for forming two-dimensional monolayer arrays of silicon nanoparticles from stabilized colloids are available. In an exemplary embodiment, electrophoretic or electrostatic deposition may be used. According to electrophoretic deposition, charged particles are caused to migrate by application of an electric field and to be deposited on a surface.

According to one exemplary embodiment, conventional electrophoretic deposition techniques may be used to deposit the exemplary oxidized nanoparticles directly onto a substrate surface. According to another exemplary embodiment, deposition may be accomplished by inertial impaction. In yet another exemplary embodiment such as shown in FIG. 2, thermophoretic deposition techniques may be used to deposit the silicon nanoparticles from the oxidized aerosol directly onto a substrate surface. FIG. 2 shows exemplary oxidized particle stream 34 being delivered to thermophoretic deposition chamber 36. Thermophoretic deposition chamber 36 includes water inlet 38 and water outlet 40 to cool the substrate within the thermophoretic deposition chamber. Thermophoretic deposition chamber 36 is shown in more detail in FIG. 5.

Figure 5:
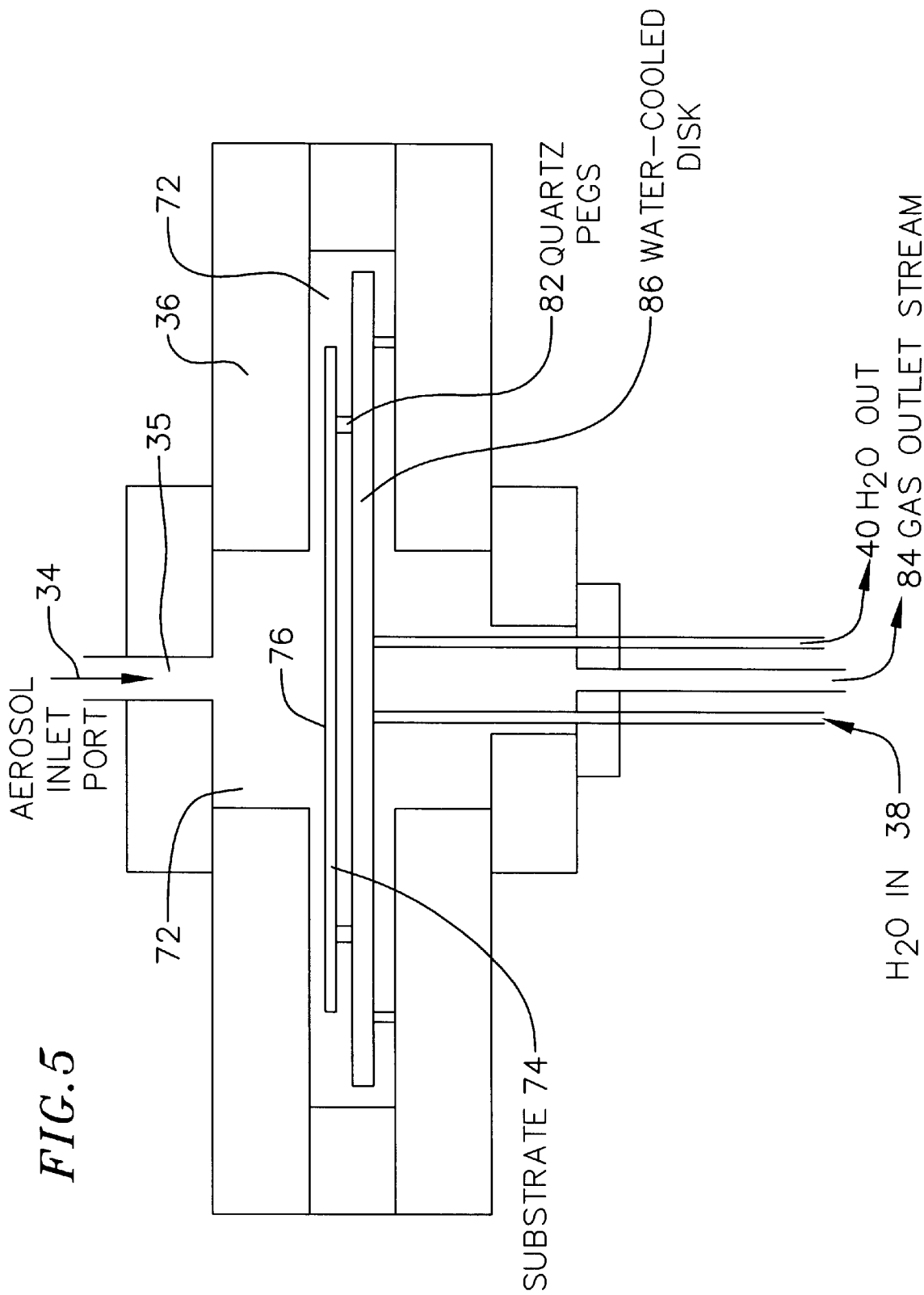
FIG. 5 is a cross-sectional view of an exemplary thermophoretic deposition system of the present invention.

Now turning to FIG. 5, thermophoretic deposition chamber 36 includes aerosol inlet port 35 through which oxidized particle stream 34 enters thermophoretic deposition chamber 36. In the exemplary deposition chamber shown in FIG. 5, aerosol oxidized particle stream 34 enters the chamber centrally and moves radially outward through the chamber and exits as gas outlet stream 84. Substrate 74 including substrate surface 76 rests on water-cooled disk 86. Water-cooled disk 86 is cooled by cooling water which enters as inlet water 38 and exits as outlet water 40 and is preferably maintained at a temperature of 23° C., although other temperatures may be used according to other exemplary embodiments. Moreover, various other suitable methods may be used to cool the underside of substrate 74 and to maintain it at a significantly lower temperature than other portions of the deposition chamber. The top of the deposition chamber is heated to 200°C. using conventional means in an exemplary embodiment, although other temperatures may be used according to other exemplary embodiments. This provides an effective temperature difference of 177° C. According to various other exemplary embodiments, temperature differences in the deposition chamber may be about 150° C., 175° C., 200° C., or values therebetween. In a preferred embodiment, the temperature difference between portions of the preferably metal deposition chamber and the water-cooled disk 86 may be at least 170° C. Since the nanoparticles within the aerosol move from high temperatures to cooler temperatures, the particles deposit on surface 76 of substrate 74. To preclude any contact between the deposition chamber and the substrate 74, substrate 74 may be supported by quartz pegs 82 in an exemplary embodiment. According to other exemplary embodiments, quartz pegs 82 may not be needed. In a preferred embodiment, substrate 74 may be a silicon wafer commonly used in the semiconductor manufacturing industry and surface 76 may include the substructure of a device onto which a monolayer of silicon nanocrystals is preferably deposited. According to other exemplary embodiments, other substrates upon which semiconductor or microelectronic devices will be formed, may be used. Thermophoretic deposition chamber 36 may be sized to accommodate various sizes of substrates 74 such as a 6" silicon wafer, an 8" silicon wafer, and other substrates of various sizes.

The thermophoretically deposited layer of silicon nanoparticles may be characterized as a stratum composed of a monolayer of nanoparticles or simply as a discontinuous layer of silicon. In an exemplary embodiment, particle densities may range from $10^{12}$ to $10^{13}$ particles per square centimeter.

FIGS. 6–10 show various characteristics of the stratum of oxidized discrete silicon nanoparticles. FIG. 6 is a cross-sectional view showing a single nanoparticle 100. Nanoparticle 100 includes core 102 and oxide shell 106. Each of core 102 and nanoparticle 100 are preferably spherical in shape. In an exemplary embodiment, diameter 104 of core 102 may be less than 15 nanometers and may range from 2–10 nanometers, most preferably 3–7 nanometers, according to various exemplary embodiments. In an exemplary embodiment, at least 90% of the cores will include a diameter between 2 and 10 nanometers. Dielectric shell 106 may include a thickness ranging from 1–10 nanometers and will include a uniform thickness of 1.5 to 2.0 nanometers in an exemplary embodiment. In a preferred embodiment, dielectric shell 106 will be an oxide shell. Dielectric shell 106 is a continuous dielectric coating which envelopes core 102. In an exemplary embodiment, silicon core 102 may represent 30–75% of the volume of silicon nanoparticle 100, including oxide shell 106. Core 102 is formed of a semiconductor material compatible with silicon processing. In the preferred embodiment, core 102 is formed of silicon, and will preferably be a crystalline silicon material. In a preferred embodiment, core 102 will be a single crystalline material. Core 102 includes a density at or near the bulk density of the pure semiconductor material of which it is formed.

Now turning to FIG. 7, a perspective view of stratum 101 of a plurality of semiconductor nanoparticles 100 is shown as being formed on substrate surface 76. The nanoparticles which make up stratum 101 are as described in FIG. 6. An aspect of the present invention is the uniformity of density of the semiconductor nanoparticles within stratum 101. Density may range from $10^{12}$ to $10^{13}$ particles/cm² but other densities may be used according to other exemplary embodiments. The stratum 101 is essentially a monolayer of discrete nanoparticles. A plurality of the discrete nanoparticles, such as exemplary nanoparticles 111 and 113, contact each other. In the preferred embodiment, the majority of adjacent nanoparticles may contact each other. It is an advantage of the present invention that the individual nanoparticles that are each capable of storing an electrical charge, are electrically isolated from one another, even if in contact. This is attributable to the presence of the dielectric coating formed on the particles prior to deposition on the substrate. Because of the ultra high purity nitrogen used and the cleaning techniques used to maintain the processing equipment in an ultra clean state, the density of foreign particle contamination on surface 76 and therefore in stratum 101, due to the deposition of stratum 101, may be less than $10^{11}$ atoms per square centimeter. The discrete nanoparticles of stratum 101 are characterized by a tightly controlled range of particle sizes. According to one exemplary embodiment, the nanoparticle cores may be less than 15 nanometers. According to an exemplary embodiment, the nanoparticles may be essentially the same size. According to an exemplary embodiment, particle sizes of the nanoparticles of stratum 101 include a particle size distribution that is approximately log-normal with respect to diameter, with a geometric standard deviation less than 1.5. The log-normal distribution is well-known in the art and is used to describe a population of samples that is normally distributed with respect to the logarithm of the distribution parameter (e.g., diameter). In an exemplary embodiment, the nanoparticles may have an average core diameter within the range of 2–10 nanometers or 3–7 nanometers and, also in an exemplary embodiment, at least 90% of the cores will include a diameter within the range of 3–7 nanometers. As noted above, cores 102, such as shown in FIG. 6, are preferably formed of single crystal material such that the semiconductor nanoparticle may be referred to as a nanocrystal. According to yet another exemplary embodiment, at least 90% of the cores of the discrete semiconductor nanoparticles may lie within a range of 2–6 nanometers, or 90% of the cores may be less than 10 nanometers.

FIG. 8 shows a cross-sectional view of a preferred embodiment of stratum 101. As shown in FIG. 8, the plurality of adjacent nanoparticles 100 contact each other laterally. Because of oxide shells 106 formed on each nanoparticle 100, adjacent semiconductor cores 102 are electrically insulated from one another and lateral shorting is precluded.

In the subsequent description, semiconductor nanoparticles 100 will be referred to as silicon nanoparticles, but the reader is reminded that such is exemplary only. Semiconductor nanoparticles 100 may be formed of other semiconductor or metal materials, alternatively. FIG. 9 is a cross-sectional view showing stratum 101 of silicon nanoparticles formed between subjacent oxide layer 153 and superjacent oxide layer 151. Stratum 101 is as shown and described in conjunction with FIGS. 7 and 8 and includes silicon nanoparticles as shown and described in FIG. 6. According to this exemplary embodiment, cores 102 essentially function as a discontinuous layer of silicon nanoparticles, each surrounded by an oxide including the oxide shells (present, but not distinguishable in FIG. 9) and the subjacent and superjacent oxide layers. The oxide shell serves to electrically insulate silicon cores 102 from one another in a monolayer formed within an oxide film formed over surface 155.

According to another exemplary embodiment, force manipulation of the deposited silicon nanoparticles may be carried out. In an exemplary embodiment, contact mode atomic force microscopy may be used to move nanocrystals that were initially in spatially random positions such as deposited and as shown in FIG. 7. An ordered structure of nanocrystal "wires" and other ordered arrays may be produced using this technique. Colloidal forces and self-assembly may alternatively be used to produce ordered deposits.

Figure 10:
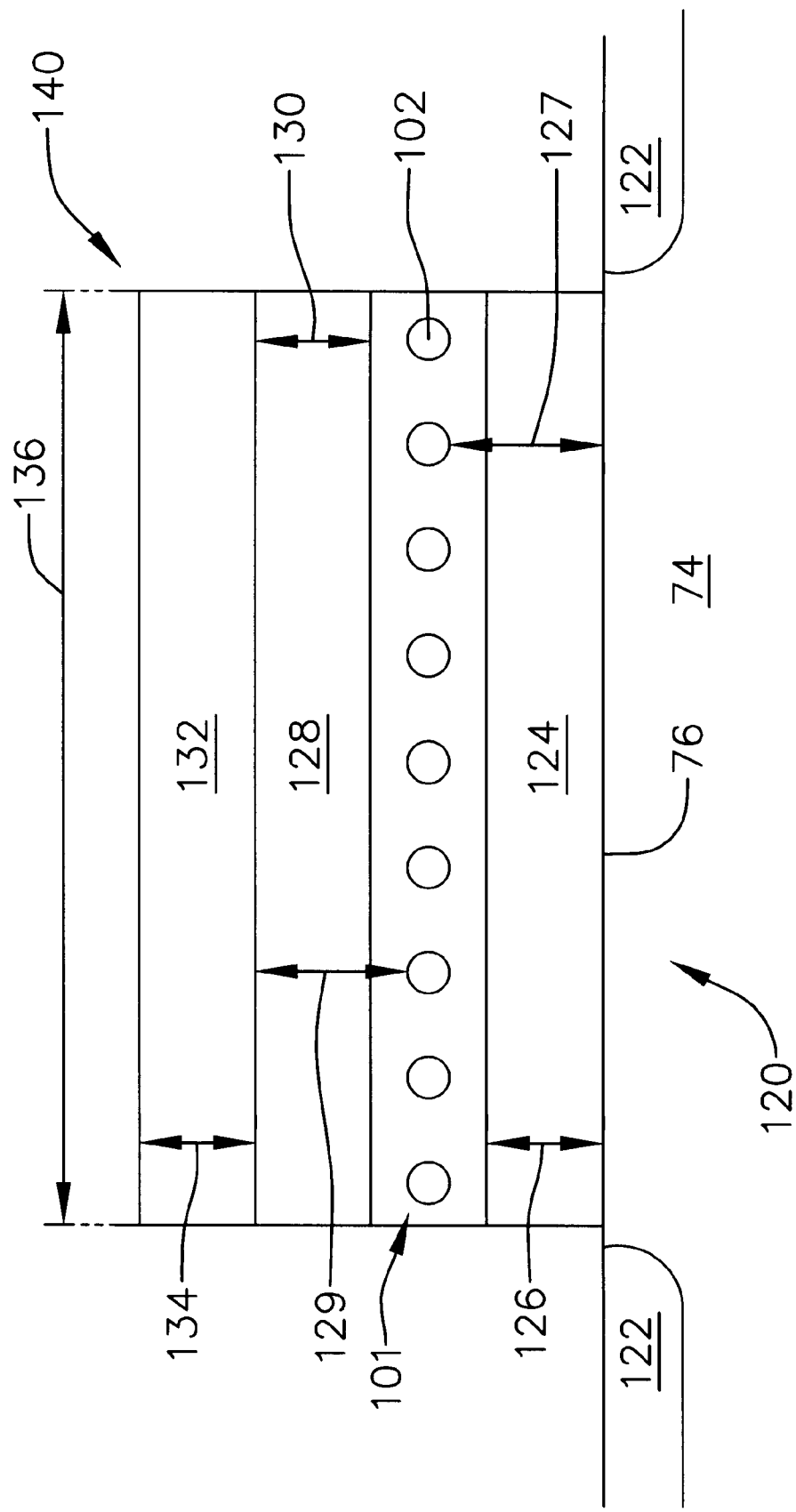
FIG. 10 is a cross-sectional view showing the gate structure of an exemplary non-volatile floating gate field effect transistor according to the present invention.

According to a preferred embodiment, the stratum of silicon nanoparticles including highly controlled particle sizes, densities and of superior uniformity may be utilized as the floating gate of a non-volatile memory, floating gate transistor. According to this embodiment, the stratum of silicon nanoparticles is formed over an oxide, referred to as a tunnel oxide, formed over gate regions of transistors. FIG. 10 shows such an exemplary structure after the various layers have been formed and the layers patterned to form a gate structure. In FIG. 10, tunnel oxide film 124 is formed over surface 76 of substrate 74 including over gate area 120. Stratum 101 of silicon nanoparticles, including cores 102, is formed over tunnel oxide 124. Upper gate oxide film 128 and gate electrode film 132 are next sequentially formed. After the sequence of films are formed over one another, including over gate area 120, situated between source/drain regions 122, conventional patterning and etching means are used to define the gate region and to form gate electrode structure 140. A plurality of such structures are preferably formed simultaneously according to the above process.

Gate structure 140 includes gate width 136, which may be less than 0.2 microns. According to one exemplary embodiment, gate width 136 may range from 0.18 microns to 1.2 microns, but other gate widths may be used according to other exemplary embodiments. Thickness 126 of tunnel oxide film 124 and thickness 130 of upper gate oxide film 128 are chosen in conjunction with the oxide shell thickness formed around each of the silicon nanoparticles in stratum 101. The thicknesses are chosen such that the total, or effective tunnel oxide thickness 127, lies within the range of 3–12 nanometers and in a preferred embodiment may lie within the range of 4–8 nanometers. According to one exemplary embodiment, thickness 126 may be 3–12 nanometers, or preferably 3–6 nanometers. Similarly, thickness 130 of upper gate oxide film 128 is chosen so that total, or effective thickness 129 of the upper gate oxide lies within the range of 6–15 nanometers. In an exemplary embodiment, thickness 130 or effective thickness 129 may lie within the range of 10–15 nanometers, but other thicknesses sufficient to preclude electrons exchanging between cores 102 and gate electrode 132 may be used alternatively. Various conventional films suitable for use as gate electrode 132 may be used and may be formed to various suitable thicknesses 134. Transistor gate structure 140 is formed over channel region 120 and between source/drain regions 122. According to other exemplary embodiments, each of tunnel oxide film 124 and upper gate oxide 128 may be formed of other dielectric materials. As discussed previously, the discrete silicon nanoparticles of stratum 101 may be of various dimensions and will preferably be crystallized silicon. Stratum 101 may alternatively be described as a discontinuous floating gate of gate structure 140. Particle size may be chosen in conjunction with gate width 136. In an exemplary embodiment, the total diameter of a silicon nanoparticle 100, including oxide shell 106, will be chosen to be less than 0.1×gate width 136. In this manner, at least ten silicon nanoparticles will be included within stratum 101 across gate width 136. Additionally, the non-volatile memory transistor formed to include gate structure 140 will include a length (depth into and out of the plane of the drawing) ranging from 10–100 microns long according to an exemplary embodiment. Other transistor lengths may be used alternatively.

Figure 11:
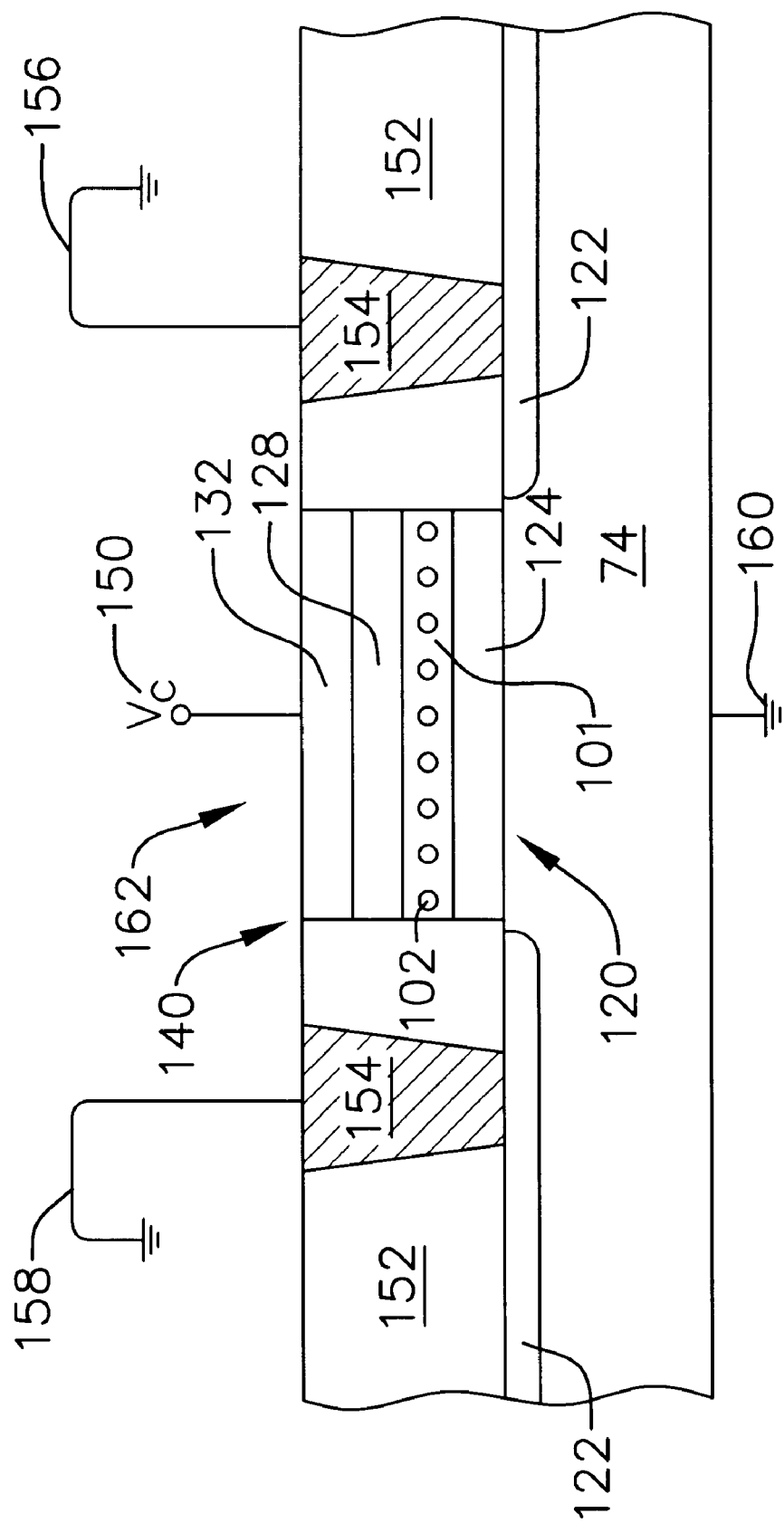
FIG. 11 is a cross-sectional view of an exemplary non-volatile floating gate field effect transistor formed according to the present invention.

Now turning to FIG. 11, floating gate transistor 162 is shown and includes gate structure 140. Floating gate transistor 162 is formed to include stratum 101 of aerosol silicon nanoparticles, and features program/erase characteristics comparable to conventional stacked gate non-volatile memory devices, excellent endurance (greater than $10^5$ program/erase cycles), and long-term non-volatility, even when a thin bottom oxide 124 of less than 6 nanometers is used. The reader is reminded that stratum 101 may be formed of nanoparticles formed of other semiconductor or metal materials, in other exemplary embodiments. Floating gate transistor 162 includes source/drain contacts 154 formed through dielectric material 152, and may be electrically coupled, biased and tested through power supplies 150, 156, 158 and 160. Power supply 150 is used to bias gate electrode 132, power supplies 156 and 158 are connected to the source/drain regions 122, and power supply 160 is coupled to substrate 74 and channel region 120. Other conventional arrangements may be used for biasing exemplary transistor 162 and conventional means may be used for programming, erasing and testing transistor 162.

Figure 12:
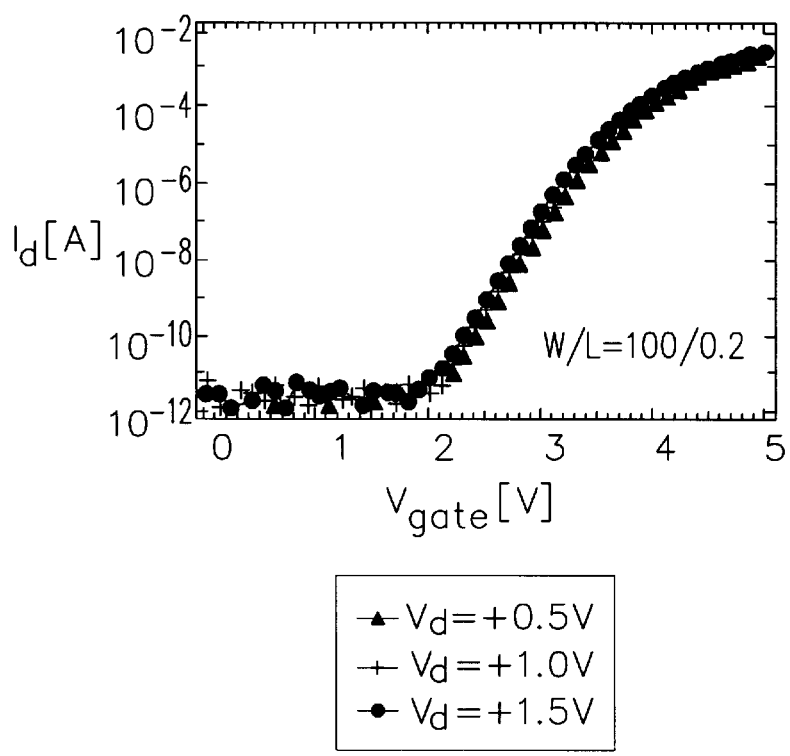
FIG. 12 is a graph showing job sub-threshold characteristics of an exemplary MOSFET formed to include a floating gate formed of the exemplary silicon nanocrystals of the present invention.
Figure 13:
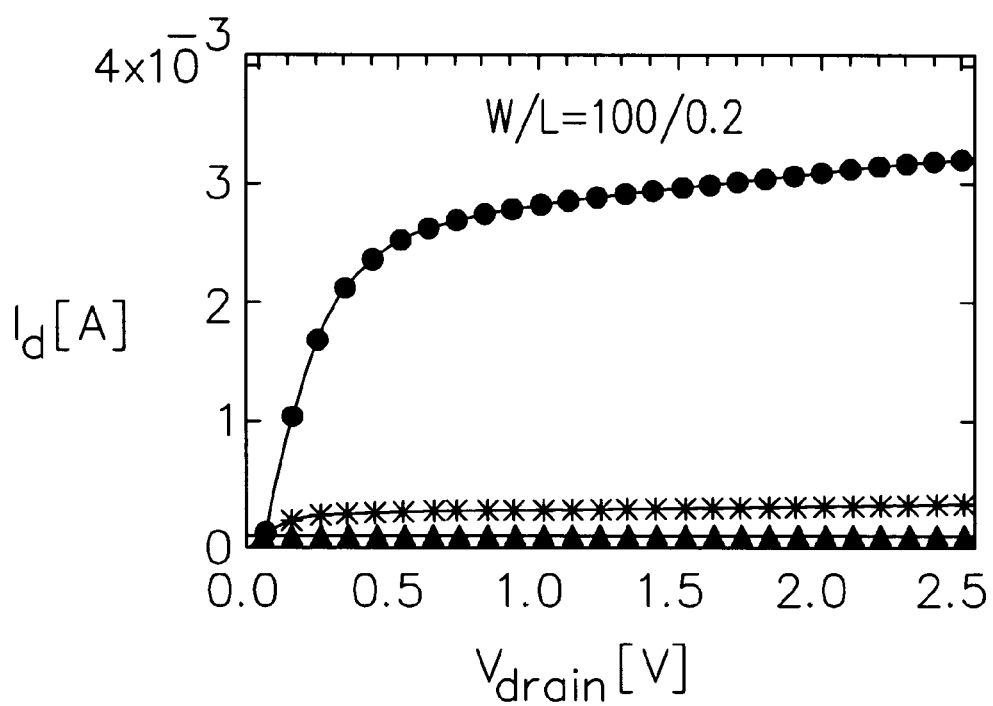
FIG. 13 is a graph showing output characteristics of an exemplary MOSFET formed to include a floating gate formed of the exemplary silicon nanocrystals of the present invention.

Typical subthreshold and output characteristics of exemplary aerosol-silicon nanocrystal field effect transistors are shown in FIGS. 12 and 13, respectively. FIG. 12 is a graph of the drive current, $I_d$, versus gate voltage, $V_{gate}$, and FIG. 13 is a graph of the drive current versus drain voltage, $V_{DRAIN}$. The values of the subthreshold slope (200 mv/dec), and the DIBL (100 mv/v) and the drive current (30 microamps/micron), are typical for thick gate dielectric, high substrate doped non-volatile memory devices. The threshold voltage, $V_t$, has been defined as the gate voltage corresponding to a drain-source current of 1 μA when a drain bias of 1 volt is applied. Uniform Fowler-Nordheim tunneling has been used for both the program and the erase operation, though programming using channel hot-electron injection is possible as well. Programming at source and drain separately also allows multi-bit storage in one device.

Figure 14:
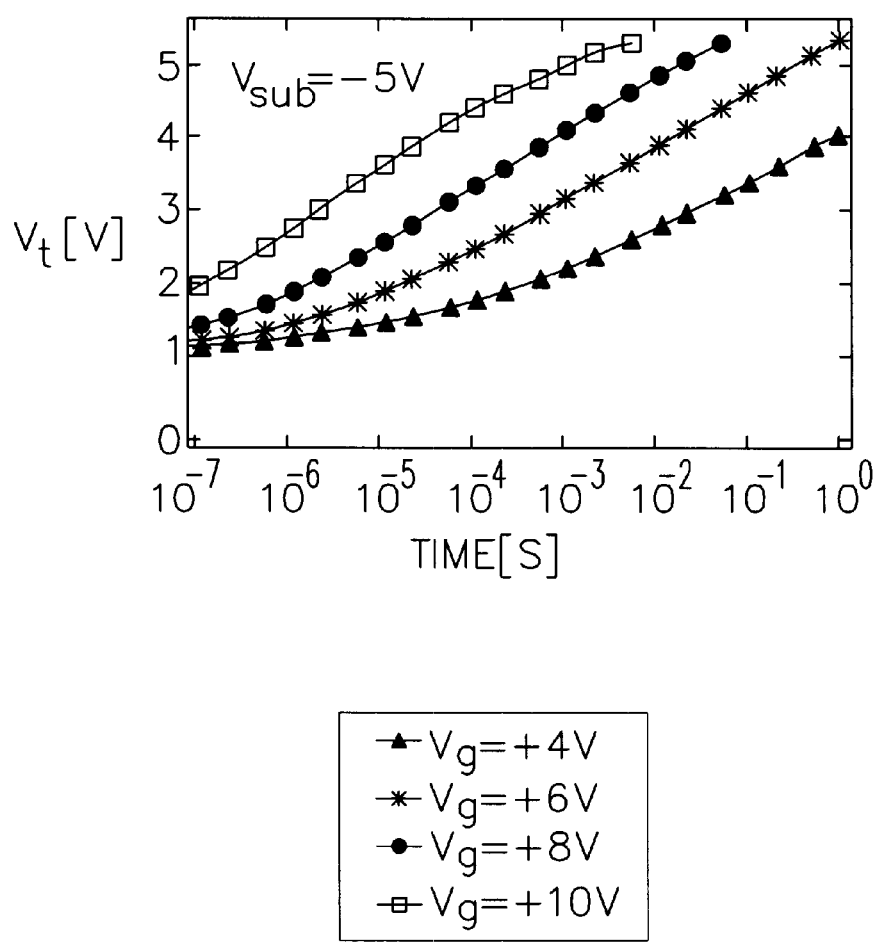
FIG. 14 is a graph showing programming transients of an exemplary MOSFET formed to include a floating gate formed of the exemplary silicon nanocrystals of the present invention.
Figure 15:
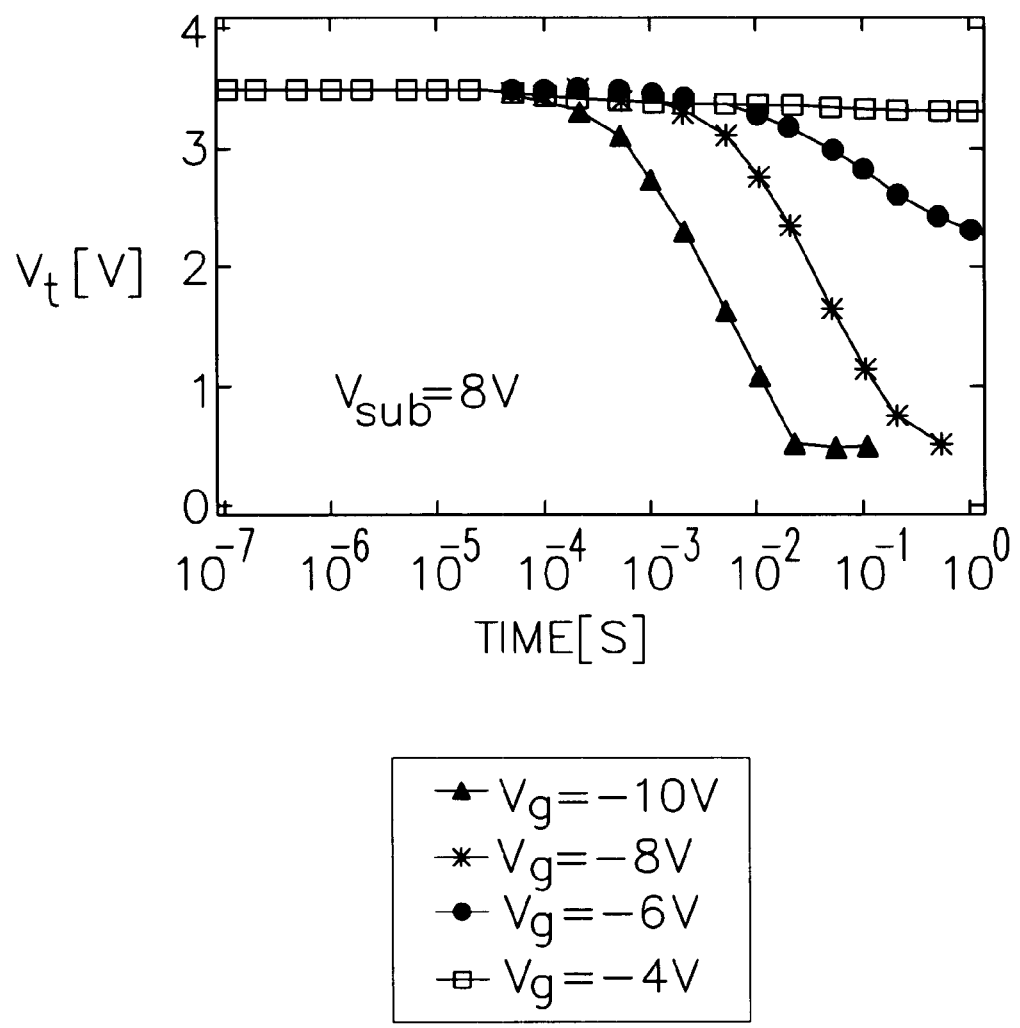
FIG. 15 is a graph showing erase transients of an exemplary MOSFET formed to include a floating gate formed of the exemplary silicon nanocrystals of the present invention.

FIG. 14 is a graph of threshold voltage versus time and shows programming transients for various gate voltages $V_g$, using a substrate bias of −5V. FIG. 15 is a graph of threshold voltage versus time and shows erase transients for various $V_g$'s, using a substrate bias of −8V. As shown in FIGS. 14, 15, 16 and 17, the high areal nanocrystal-density obtained by the aerosol fabrication process results in a large threshold voltage window of at least two volts. The device programs to a high $V_t$ of about +3.3 volts in 50 μs with gate and substrate bias of +8V and −5V, respectively. The device erases to a low $V_t$ of about +1V in 100 ms with gate and substrate bias of +8V and −8V, respectively. According to this exemplary embodiment, the threshold voltage window is about 2.3 volts, but other threshold voltage windows may be produced according to other exemplary embodiments.

Figure 16:
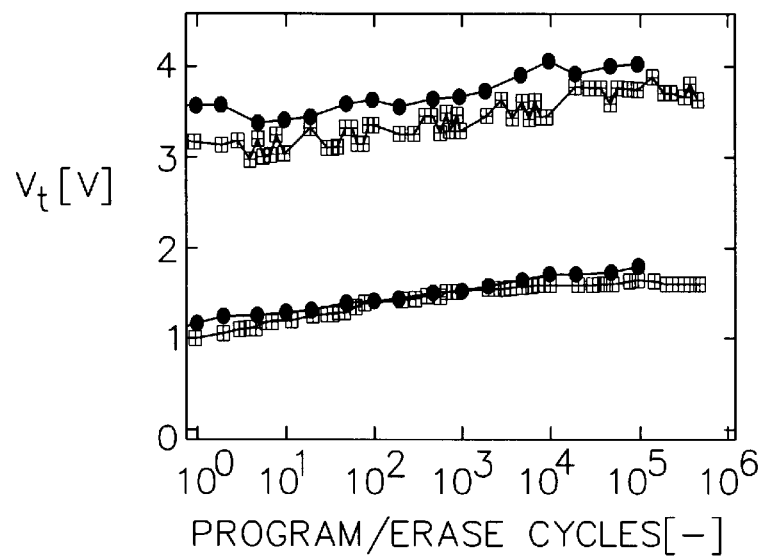
FIG. 16 is a graph showing endurance characteristics of an exemplary MOSFET formed to include a floating gate formed of the exemplary silicon nanocrystals of the present invention.

FIG. 16 is a graph indicative of endurance characteristics and showing the program and erase $V_t$ as a function of number of program/erase cycles. As shown in FIG. 16, the aerosol non-volatile memory devices feature excellent endurance behavior as demonstrated by the small $V_t$ window closure observed after 5×10⁵ program/erase cycles. It can be seen that less than a 15% closure of the program/erase $V_t$ window is observable after 5×10⁵ program/erase cycles. The gradual shift of the $V_t$ window to higher threshold voltages is indicative of charge being built up in the gate oxide layer during cycling. Additionally, in spite of thin tunnel oxides used, reasonable disturb times and long non-volatility is obtained indicative of intrinsic advantages of nanocrystal charge storage. No stress induced leakage current has been observed. No drain disturb was detected even using drain voltages as high as 4 volts, which is indicative of the absence of lateral conduction between the nanocrystals in stratum 101.

FIG. 17 is a graph showing retention and disturb characteristics (threshold voltage −$V_t$, versus time) of an exemplary MOSFET formed to include a floating gate formed of exemplary silicon nanocrystals of the present invention.

The preceding merely illustrates the principles of the invention. It will thus be appreciated that those skilled in the art will be able to devise various arrangements which, although not explicitly described or shown herein, embody the principles of the invention and are included within its spirit and scope. For example, the present invention can be used to provide various and multiple strata of silicon and other semiconductor nanoparticles for various applications in the semiconductor/microelectronics industry. According to various exemplary embodiments, multiple strata of various nanoparticles may be formed directly on one another according to the process of the present invention.

All examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A semiconductor device comprising a stratum formed of a plurality of discrete particles, each of said particles having a core formed of one of metal and semiconductor material and being enveloped by a continuous dielectric coating formed on a surface thereof, the majority of said cores of said particles formed of a single crystalline material and including a density substantially as great as the bulk density of the material of which said cores are formed.

2. The semiconductor device as in claim 1, in which said particles of said stratum are arranged substantially in a monolayer.

3. The semiconductor device as in claim 1, in which said particles are substantially the same size.

4. The semiconductor device as in claim 1, in which said stratum includes a density of said particles within the range of about $10^{12}$–$10^{13}$ particles/cm².

5. The semiconductor device as in claim 1, in which a plurality of adjacent particles contact each other.

6. The semiconductor device as in claim 1, in which said cores are substantially spherical.

7. The semiconductor device as in claim 1, in which said particles include silicon cores.

8. The semiconductor device as in claim 7, in which said silicon cores have an average diameter within a range of 3–7 nanometers.

9. The semiconductor device as in claim 7, in which said silicon cores are single crystalline silicon.

10. The semiconductor device as in claim 1, in which at least 90 percent of said cores have a diameter within the range of 2–10 nanometers.

11. The semiconductor device as in claim 1, in which said cores occupy approximately 30–75 percent of the volume of said discrete particles.

12. The semiconductor device as in claim 1, in which said particles include a distribution of particle diameters that is approximately log-normal, and said distribution includes a geometric standard deviation of less than 1.5.

13. The semiconductor device as in claim 1, wherein said dielectric coating comprises an oxide coating.

14. The semiconductor device as in claim 1, in which each of said cores is crystalline.

15. The semiconductor device as in claim 1, characterized by said stratum including a foreign particle contamination level being less than $10^{11}$ atoms/cm².

16. The semiconductor device as in claim 1, in which said dielectric coating includes a thickness ranging from 1.5–2.0 nanometers.

17. A semiconductor device comprising a floating gate transistor including a tunnel oxide, a stratum of discrete nanoparticles formed over said tunnel oxide, and an upper gate oxide formed over said stratum, said stratum comprising a plurality of electrically isolated discrete crystallized nanoparticles, a majority of said nanoparticles being single crystalline, and each of said nanoparticles having a density substantially as great as the bulk density of the material of which said nanoparticles are formed and being enveloped by a continuous dielectric coating formed on a surface thereof.

18. The semiconductor device as in claim 17, wherein said nanoparticles comprise silicon nanoparticles.

19. The semiconductor device as in claim 17, in which each nanoparticle includes an oxide shell and in which a plurality of adjacent nanoparticles contact each other.

20. The semiconductor device as in claim 17, in which said nanoparticles have an average diameter within the range of 2–6 nanometers.

21. The semiconductor device as in claim 17, in which at least 90 percent of said nanoparticles include a diameter within the range of 2 to 6 nanometers.

22. The semiconductor device as in claim 17, in which said tunnel oxide includes a thickness within the range of 3–6 nanometers.

23. The semiconductor device as in claim 17, in which said floating gate transistor includes a gate width within the range of 0.18 microns to 1.2 microns.

24. The semiconductor device as in claim 17, in which said upper gate oxide includes a thickness within a range of 6–15 nanometers.

25. The semiconductor device as in claim 18, in which said stratum includes said discrete silicon nanoparticles having a density within a range of $10^{12}$ to $10^{13}$ nanoparticles/cm$^2$.

26. The semiconductor device as in claim 18, in which said floating gate transistor includes a gate width and said discrete silicon nanoparticles include an average diameter being no greater than 0.1 of said gate width.

27. The semiconductor device as in claim 17, in which said gate width is less than or equal to 0.2 microns.

28. The semiconductor device as in claim 17, in which said floating gate transistor has a threshold voltage window of at least 2 volts.

29. The semiconductor device as in claim 17, in which said floating gate transistor includes a threshold voltage of about 3.3 volts when programmed and a threshold voltage of about 1 volt when erased.

30. The semiconductor device as in claim 17, in which said floating gate transistor is characterized by less than a 15% $V_t$ window closure after $5 \times 10^5$ program/erase cycles.

31. The semiconductor device as in claim 17, in which said plurality of discrete nanoparticles are characterized as having a distribution of particle sizes that is approximately log-normal, and said distribution includes a geometric standard deviation of less than 1.5.

* * * * *